United States Patent
Kobayashi et al.

[11] Patent Number: 6,045,672
[45] Date of Patent: *Apr. 4, 2000

[54] SPUTTERING APPARATUS

[75] Inventors: Masahiko Kobayashi; Nobuyuki Takahashi, both of Kanagawa, Japan

[73] Assignee: Anelva Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/859,093

[22] Filed: May 20, 1997

[30] Foreign Application Priority Data

May 21, 1996 [JP] Japan .................................. 8-150041

[51] Int. Cl.[7] .................................................. C23C 14/35
[52] U.S. Cl. .............................. 204/298.2; 204/298.19; 204/298.03
[58] Field of Search ................. 204/298.16, 298.17, 204/298.19, 298.2, 192.12, 298.03

[56] References Cited

U.S. PATENT DOCUMENTS

| | | | |
|---|---|---|---|
| 4,401,539 | 8/1983 | Abe et al. | 204/298.19 |
| 4,746,417 | 5/1988 | Ferenbach et al. | 204/298.2 |
| 4,747,926 | 5/1988 | Shimizu et al. | 204/192.12 |
| 4,891,560 | 1/1990 | Okumura et al. | 204/298.19 |

FOREIGN PATENT DOCUMENTS

| | | | |
|---|---|---|---|
| 59-215484 | 12/1984 | Japan | 204/298.2 |
| 62-89864 | 4/1987 | Japan | 204/298.2 |
| 63-100180 | 5/1988 | Japan | 204/298.2 |
| 7-272474 | 11/1995 | Japan | C23C 14/54 |

*Primary Examiner*—Rodney McDonald
*Attorney, Agent, or Firm*—Sughrue, Mion, Zinn, Macpeak & Seas, PLLC

[57] ABSTRACT

A sputtering apparatus with improved bottom coverage ratio, is used in a film depositing step for manufacturing a semiconductor integrated circuit or the like. In the apparatus, arcuate leakage lines of magnetic force emerge from a magnet mechanism which is part of a cathode, and the lines of magnetic force are ranged into a circumferential shape so as to set a plurality of circumferential magnetic fields on the surface of a target. The plurality of circumferential magnetic fields form a plurality of erosion regions having a circumferential shape, without the regions crossing each other. When the diameter of the deepest erosion portion is small, the incident angle of sputter particles can be made small without increasing the target-to-substrate distance. Specifically, in a portion of the substrate on which sputter particles impinge at the largest incident angle from the deepest erosion portion of the erosion regions, the incident angle is smaller than that in the case of a single erosion region, thereby allowing an improved bottom coverage ratio of the fine holes in the substrate, while maintaining a required film deposition rate.

6 Claims, 18 Drawing Sheets

CONFIGURATION OF LOW-PRESSURE LONG-DISTANCE SPUTTERING

CONFIGURATION OF LOW-PRESSURE LONG-DISTANCE SPUTTERING

CONFIGURATION OF LOW-PRESSURE
LONG-DISTANCE SPUTTERING

CONFIGURATION OF LOW-PRESSURE
LONG-DISTANCE SPUTTERING

SPUTTERING APPARATUS

BACKGROUND OF THE INVENTION

1. Field of the Invention

The invention relates to a sputtering apparatus, and particularly to a sputtering apparatus which is used in a film depositing step for manufacturing a semiconductor integrated circuit or the like.

2. Description of the Related Art

In a thin film deposition using sputtering, and particularly in sputtering used in a film depositing step for manufacturing a highly-integrated semiconductor device, it is strongly requested to deposit a film at the bottom of a fine hole of a high aspect ratio with an excellent step coverage performance, that is, to improve the bottom coverage ratio.

In order to comply with the requirement, improvements have been made so that a film is deposited while allowing only sputter particles of a small incident angle to enter a fine hole. One of the improvements is a technique called collimate sputtering.

FIG. 10 is a view schematically illustrating a collimate sputtering apparatus as an example of a conventional sputtering apparatus in which the bottom coverage ratio is improved. In the apparatus shown in FIG. 10, a cathode 2 and a substrate holder 3 are disposed so as to oppose each other in a vacuum vessel 1. The cathode 2 comprises a magnet mechanism 4, and a target 5 which is located in front of the magnet mechanism 4. A substrate 30 on which a film is to be deposited is placed on the front face of the substrate holder 3.

A collimator 6 is disposed in a space between the cathode 2 and the substrate holder 3. The collimator 6 has a structure in which a number of small cylindrical members are arranged in a segmental form so that their height directions coincide with a direction perpendicular to the substrate 30 (hereinafter, the direction is referred to as the axial direction), whereby many flow paths for sputter particles are segmentally formed along the axial direction. This structure is often called a "grid-shaped" or "honeycomb" structure.

Sputter particles emitted from the target 5 are distributed in accordance with the cosine law. Therefore, also many sputter particles of a large incident angle enter the collimator 6. However, most of such sputter particles are deposited on the wall faces of the flow paths of the collimator 6, with the result that sputter particles emitted from the collimator 6 mainly consist of those of a small incident angle. Consequently, only sputter particles of a small incident angle impinge on the substrate 30, so that the step coverage performance for the bottom of a fine hole formed in the surface of the substrate 30 is improved.

In the collimate sputtering apparatus described above, however, the deposition of sputter particles on the collimator 6 reduces the sectional areas of the flow paths of the collimator 6, with the result that the amount of sputter particles which can pass through the collimator 6 is reduced with the passage of time. Therefore, the sputtering rate is gradually lowered.

Recently, an apparatus which is called a low-pressure long-distance sputtering apparatus and in which the distance between a target and a substrate (hereinafter, the distance is referred to as the TS distance) is increased (3 to 6 times that of the conventional apparatus) has been developed as a sputtering apparatus which is free from the above problem and which has a high bottom coverage ratio. FIG. 11 is a view schematically illustrating a low-pressure long-distance sputtering apparatus as another example of a conventional sputtering apparatus.

In the apparatus shown in FIG. 11, in the same manner as that of FIG. 10, a cathode 2 and a substrate holder 3 are disposed so as to oppose each other in a vacuum vessel 1, a target 5 is located in front of a magnet mechanism 4, and a substrate 30 is placed on the front face of the substrate holder 3. The TS distance is set to be, for example, about 150 to 360 mm. The pressure of the interior of the vacuum vessel 1 is set to be lower than that in the conventional system or to be about 1 mTorr or less. This pressure reduction is conducted in order that the mean free path of sputter particles is increased and sputter particles are less scattered. Since scattering of sputter particles is reduced in level, many sputter particles can impinge on the substrate in a direction substantially perpendicular to the substrate, thereby enabling the bottom coverage ratio of a fine hole to be improved.

Specifically, for example, Japanese Patent Unexamined Publication No. Hei. 7-292474 describes that the bottom coverage ratio can be improved under the conditions that the diameter of a target is 250 mm, the diameter of a substrate is 200 mm, the TS distance is 300 mm, and the pressure is $3 \times 10^{-2}$ Pa.

As shown in Table 3 of the publication, however, the film deposition rate is largely lowered when the TS distance is increased in order to improve the bottom coverage ratio. Consequently, although effective in film deposition in a fine hole in a process for 256 Mbits or more (line width: 0.25 $\mu$m, aspect ratio: 4 to 6), the technique of low-pressure long-distance sputtering remains to have a problem in productivity. When the TS distance is reduced in order to increase the film deposition rate, the bottom coverage ratio is lowered, and hence it is difficult to apply the technique to a process for 256 Mbits or more. In other words, in low-pressure long-distance sputtering, the film deposition rate and the bottom coverage ratio are in tradeoff relationship and not compatible with each other.

On the other hand, a sputtering process is further required to adapt to a substrate of an enlarged size. In a process of manufacturing a semiconductor device such as that described above, the size of a substrate tends to be enlarged in order to manufacture a larger number of devices from one substrate and improve the productivity. Also in a sputtering process to be conducted on a glass substrate in manufacture of a liquid crystal display device, the size of a substrate tends to be enlarged in order to widen the display area.

Such an enlarged size of a substrate is complicatedly entangled with the factors of the TS distance and the film deposition rate in low-pressure long-distance sputtering described above.

First, an enlarged size of a substrate raises a problem in that, also in low-pressure long-distance sputtering, the bottom coverage ratio is insufficient in a portion remote from the center or a peripheral portion of the substrate. This problem will be described with reference to FIGS. 12, 13 (A) and 13 (B).

FIGS. 12, 13 (A) and 13 (B) illustrate the problem which arises in the film deposition on a large substrate with using the apparatus of FIG. 11. FIG. 12 is a partial diagrammatic view of the target and a substrate in the apparatus, and FIGS. 13 (A) and 13 (B) are section views showing the bottom coverage ratios of the vicinity of the center of the substrate and the peripheral portion.

As shown in FIG. 12, the target 5 and the substrate 30 are disposed in parallel so as to oppose each other, and their center axes 20 (the axes passing the center and perpendicular to the surface) are on the same line. FIG. 12 shows only portions which are on the one side with respect to the center axes 20.

When sputtering is done, erosion occurs in the surface of the target 5 as indicated by the hatched portion in FIG. 12. In fine holes 301 which are respectively formed in the vicinity of the center of the substrate 30 and the peripheral portion, a film is deposited in different manners as shown in FIGS. 13 (A) and 13 (B). In the vicinity of the center of the substrate 30, as shown in FIG. 13 (A), a film 302 is deposited at the bottom of the fine hole 301 with an excellent step coverage performance. In contrast, in the peripheral portion of the substrate 30 which is outside the portion of the same diameter as that of the target 5, the number of sputter particles which impinge from the side of the center axis at a large incident angle is increased, and hence the fine hole 301 has a state in which, as shown in FIG. 13 (B), the film 302 is deposited on the wall face on the side of the peripheral edge of the substrate 30 but is not deposited on the wall face on the side of the center axis and the bottom face.

In the case of deposition of a barrier metal on the inner face of a contact hole, such a state results in a fatal defect. When a large substrate is to be used, therefore, the size of the target must be correspondingly increased.

This problem of the increased size of a substrate is complicatedly entangled with the above-mentioned problem of incompatibility of the film deposition rate and the TS distance required for the bottom coverage ratio, whereby the problems are worsened. This will be described with using data in the company of the assignee of the present application.

FIGS. 14 to 17 show experimental data relating to low-pressure long-distance sputtering. FIG. 14 shows data indicating the dependence of the bottom coverage ratio on the pressure and the TS distance, and FIG. 15 shows data indicating the dependence of the distribution of the sheet resistivity of an obtained thin film on the pressure and the TS distance. FIGS. 16 and 17 show data indicating relationships between the bottom coverage ratio and the aspect ratio. FIG. 16 shows the case where the TS distance is 340 mm, and FIG. 17 that where the TS distance is 260 mm. These data are obtained under the conditions that the diameter of the substrate is 6 inches and that of the target is 269 mm.

As shown in FIG. 14, it can be seen that the bottom coverage ratio is improved in a low pressure range. The bottom coverage ratio in the case where the TS distance is 100 mm is higher than that in the case where the TS distance is 65 mm. Furthermore, the bottom coverage ratio in the peripheral portion of the substrate is higher than that in the vicinity of the center of the substrate.

As shown in FIG. 15, when the TS distance is increased, the uniformity of the distribution of the sheet resistivity tends to be impaired. However, this tendency is moderated by reducing the pressure. Specifically, in the case where the pressure is 2.0 mTorr or less, the distribution of the sheet resistivity hardly changes even when the TS distance is increased.

Next, the relationships between the bottom coverage ratio and the aspect ratio will be discussed. As shown in FIG. 16, when the aspect ratio is 2, it is possible to attain a bottom coverage ratio of 40 to 45%. It is generally known that, when the bottom coverage ratio is about 15%, there arises no problem in properties of a device. Also from this point of view, it will be seen that the low-pressure long-distance sputtering method is a very excellent technique. In a collimate sputtering apparatus such as that shown in FIG. 10, the bottom coverage ratio is about 15%. From this, excellence of the low-pressure long-distance sputtering method will be again noted.

In FIG. 16, the mark ○ indicates the bottom coverage ratio in the vicinity of the center of the substrate, and the mark ● that in the peripheral portion. In both the sets of data, the data are arranged on the same line. This shows that the bottom coverage ratio in the face of the substrate maintains high uniformity. The film deposition rate is similar to that of the collimate sputtering method or about 600 angstroms per minute. Namely, the film deposition rate is reduced to about ⅓ to ¼ of that of sputtering of the conventional system.

In contrast, when the TS distance is reduced to 260 mm, the film deposition rate is improved to 1,000 angstroms per minute. As shown in FIG. 17, however, the bottom coverage ratio is lowered to about 28 to 35% in the case of the aspect ratio of 2. Even in this case, the bottom coverage ratio is higher than that of the collimate sputtering method or 15%.

From these results, the bottom coverage ratio and the film deposition rate in the case where the substrate is increased in size or has a diameter of, for example, 300 mm will be studied. FIG. 18 is a view showing results of studies on the effects of the enlarged size of the substrate on the bottom coverage ratio and the film deposition rate. In FIG. 18, the hatched portions indicate the sectional shape of erosion in the target 5.

First, as shown in FIG. 17, an excellent bottom coverage ratio can be attained under the conditions that the diameter of the target is 269 mm and the TS distance is 340 mm (FIG. 18 (*a*)). This is applicable also to the case where the substrate 30 is smaller than the target 5 or has a diameter of 8 inches.

When the substrate 30 is made larger than the target 5 or has a diameter of 300 mm, also the target 5 must be enlarged to a size similar to that of the substrate 30 as described above. In this case, it is considered that, in order to attain a bottom coverage ratio of a similar level, the TS distance must be further increased.

This will be described by using the flying path of sputter particles from the deepest erosion portion as the representative. In many sputtering processes, in the region on a target where erosion occurs (hereinafter, referred to as the erosion region), a specific portion in a radial direction of the target tends to be eroded most deeply (hereinafter, such a portion is referred to as the deepest erosion portion), and sputter particles emitted from this portion dominantly affect the state of the film deposition. In planar magnetron sputtering or the like which is mainly used today, the erosion region forms a circumferential shape. In many cases, therefore, the deepest erosion portion has a circumferential shape.

FIGS. 19 and 20 are views illustrating the circumferential shape of the deepest erosion portion. FIG. 19 is a schematic perspective view of a magnet mechanism used in a conventional apparatus, and FIG. 20 is a schematic perspective view of a cathode used in the conventional apparatus. In an apparatus such as that shown FIGS. 10 or 11, the magnet mechanism 4 disposed in the back of the flat target 5 comprises a column-shaped center magnet 412 fixed onto a disk-shaped yoke 411, and a cylindrical peripheral magnet 413 which surrounds the center magnet 412 with leaving a gap therebetween.

The different magnetic poles appear on the front faces of the center magnet 412 and the peripheral magnet 413, respectively. For example, the center magnet 412 constitutes the S-pole and the peripheral magnet 413 constitutes the N-pole. In this case, lines of magnetic force emerging from the peripheral magnet 413 pass through the target 5 to leak from a certain portion of the surface of the target 5, arcuately warp as shown in FIGS. 19 and 20, enter another portion of the surface of the target 5, and then pass through the target 5 to reach the center magnet 412. These leakage lines of magnetic force are ranged along the shape of the gap between the center magnet 412 and the peripheral magnet 413, thereby forming a circumferential magnetic field as shown in FIGS. 19 and 20.

In a sputtering process using a function of a magnetic field, such as magnetron sputtering, electrons are captured by the magnetic field, so that the efficiency of ionizing gas molecules is improved. Consequently, the region of the target 5 which is sputtered by ions, i.e., the erosion region 50 has a shape corresponding to that of the magnetic field. In the above example in which a circumferential magnetic field is set, the region has a circumferential shape.

In magnetron sputtering, electrons perform the magnetron motion in a region where the electric field orthogonally crosses the magnetic field, and the ionization efficiency is maximum in the region. In the configuration of FIGS. 19 and 20, therefore, the orthogonal relationship between the electric field and the magnetic field is established in the summit portion of the arcuate leakage lines of magnetic force, and strong erosion tends to occur in the portion below the summit portion. In other words, the deepest erosion portion draws a circumferential shape located below the summit portion of the arcuate leakage lines of magnetic force.

As described above, sputter particles are vigorously emitted from the deepest erosion portion. Consequently, it seems that the geometrical arrangement of the deepest erosion portion most significantly affects the state of the film deposition on the substrate. It is considered that, when the target 5 and the substrate 30 are coaxially arranged so as to oppose each other as shown in FIGS. 10 and 11, the deepest erosion portion of the half circumferential portion or one half of the target 5 affects the film deposition in the corresponding half region of the substrate 30 but does not affect that in the other half region, because the surface of the other half region of the substrate 30 is affected by erosion in the other half circumferential portion of the target 5.

Sputter particles emitted from the deepest erosion portion of one half circumferential portion will be considered here. Among such sputter particles, those impinging on the vicinity of the center of the substrate 30 have the largest incident angle with respect to the substrate 30. In the case where the radius of the deepest erosion portion is not larger than one half of the radius of the target 5, sputter particles impinging on the peripheral portion of the substrate 30 have the smallest incident angle. However, such a case seldom happens.

In the example of FIG. 18 (a) in which the target has a diameter of 269 mm, when the deepest erosion portion is produced at a position separated from the center axis 20 by, for example, 70 mm (the diameter: 140 mm), the incident angle θ of sputter particles impinging on the vicinity of the center of the substrate 30 is about 11.6° under the conditions that the TS distance is 340 mm.

In contrast, when the substrate 30 of a larger size or having a diameter of 300 mm is used, also the target 5 must be enlarged so as to have a similar size as described above. As shown in FIG. 18 (b), when the target 5 which is slightly larger than the substrate 30 or has a diameter of 314 mm is used, and the deepest erosion portion is produced at a position corresponding to a diameter of 163 mm, if the same TS distance as the above is employed, the incident angle θ of sputter particles impinging on the vicinity of the center is increased to about 13.5°. In order to set the same incident angle as that of FIG. 18 (a) and attain a similar bottom coverage ratio, therefore, the TS distance must be increased to a large value or 397 mm. When the TS distance is increased to such a large value, the film deposition rate is impaired to a low level at which the film deposition is practically impossible.

To comply with this, for example, as shown in FIG. 18 (d), the TS distance is set to be 303 mm (similar to the diameter of the substrate) in a practical range, so that the incident angle θ in the vicinity of the center is about 15.0°. Namely, the incident angle is increased to be (15.0/11.3)=1.3 times that of FIG. 18 (b). The incident angle of 15.0° is equal to that attained in the case where the target 5 of a conventional size or 269 mm (the diameter of the deepest erosion portion is 140 mm) is used and the TS distance is about 260 mm (FIG. 18 (c)). This configuration is identical with the sputtering from which the data of FIG. 17 were obtained, and can obtain only a bottom coverage ratio of about 28 to 35% for a fine hole of an aspect ratio of 2.

As described above, even when the low-pressure long-distance sputtering method is employed, it is difficult for the conventional configuration to improve the bottom coverage ratio while maintaining a required film deposition rate so as to comply with the tendency to enlarge a substrate.

SUMMARY OF THE INVENTION

In order to solve the problems, the invention provides a sputtering apparatus comprising: a vacuum vessel having a pumping system; a target located at a position in the vacuum vessel; and a magnet mechanism which sets a magnetic field on a surface of the target, a substrate being disposed opposing the target, the target being sputtered while ions are captured by the magnetic field produced by the magnet mechanism, thereby depositing a thin film on a surface of the substrate, wherein the magnet mechanism sets leakage lines of magnetic force which emerge from a portion of the surface of the target and enter another portion of the surface of the target, and also a plurality of circumferential magnetic fields each of which is formed by ranging the leakage lines of magnetic force into a circumferential shape on the surface of the target, so that a plurality of erosion regions are formed on the surface of the target by the circumferential magnetic field without crossing each other, each of the erosion regions having a circumferential shape when the magnet mechanism is relatively stationary with respect to the target.

DETAILED DESCRIPTION OF THE PREFERRED EMBODIMENTS

Hereinafter, embodiments of the invention will be described.

Figure 1:
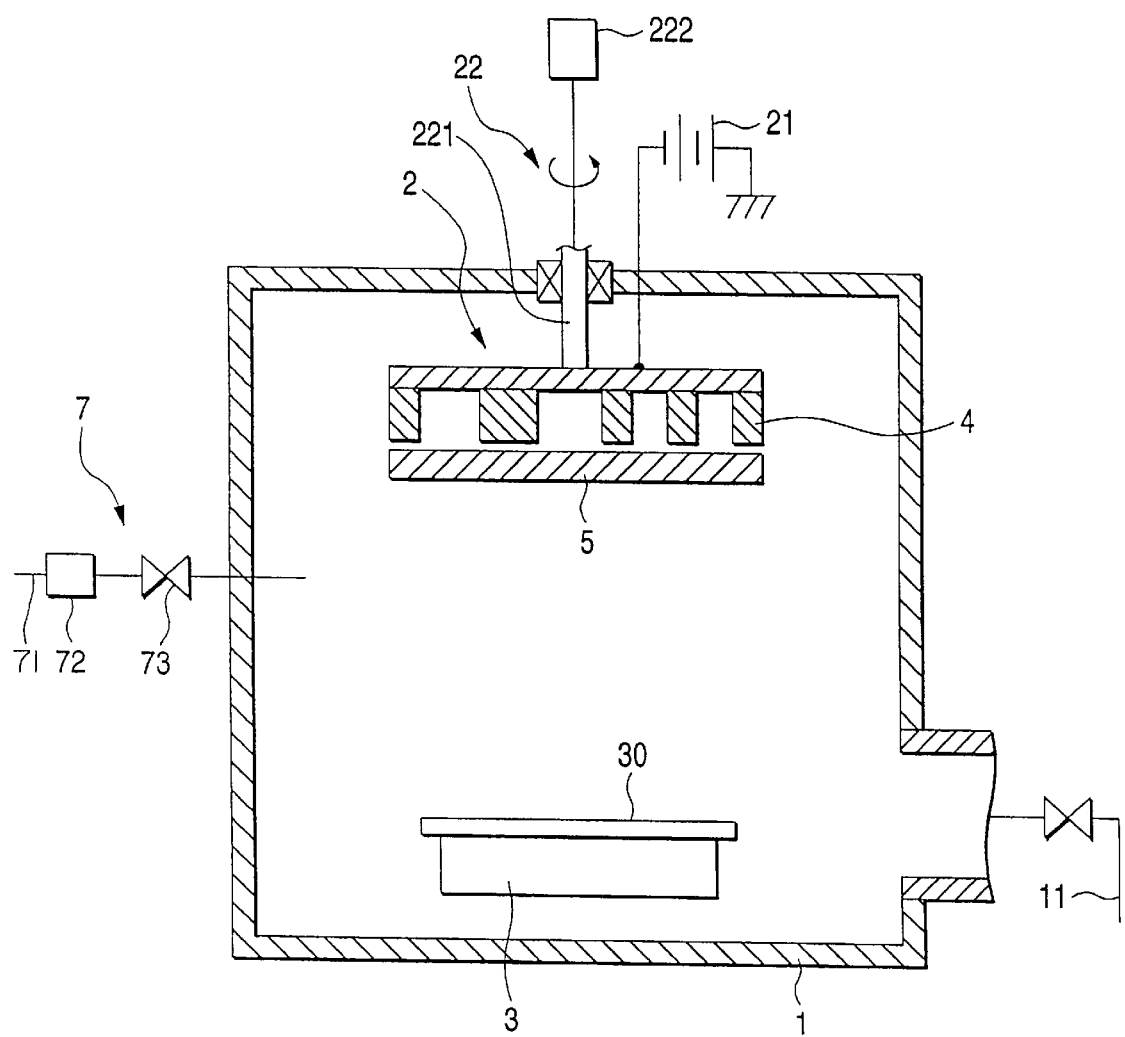
FIG. 1 is a view schematically illustrating a sputtering apparatus of a first embodiment of the invention.

FIG. 1 is a view schematically illustrating a sputtering apparatus of a first embodiment of the invention. The sputtering apparatus shown in FIG. 1 comprises: a vacuum vessel 1 having a pumping system 11; a cathode 2 and a substrate holder 3 which are disposed so as to oppose each other in the vacuum vessel 1; a gas introducing system 7 which introduces a gas into the vacuum vessel 1; a cathode power source 21 which applies a given voltage to the cathode 2; and the like.

Figure 2:
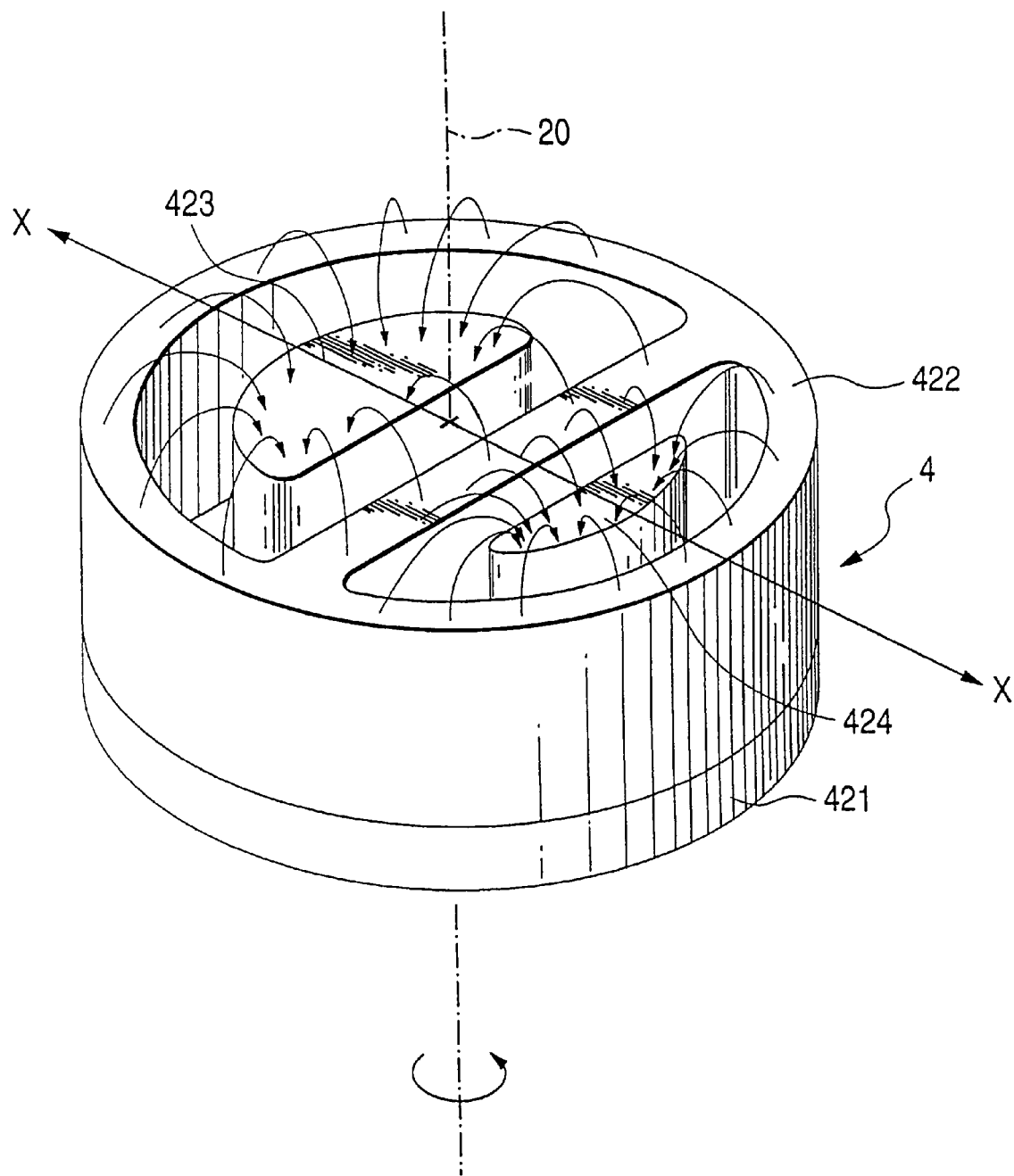
FIG. 2 is a schematic perspective view illustrating the configuration of a cathode in the apparatus of FIG. 1, and the configuration of a magnet mechanism.
Figure 3:
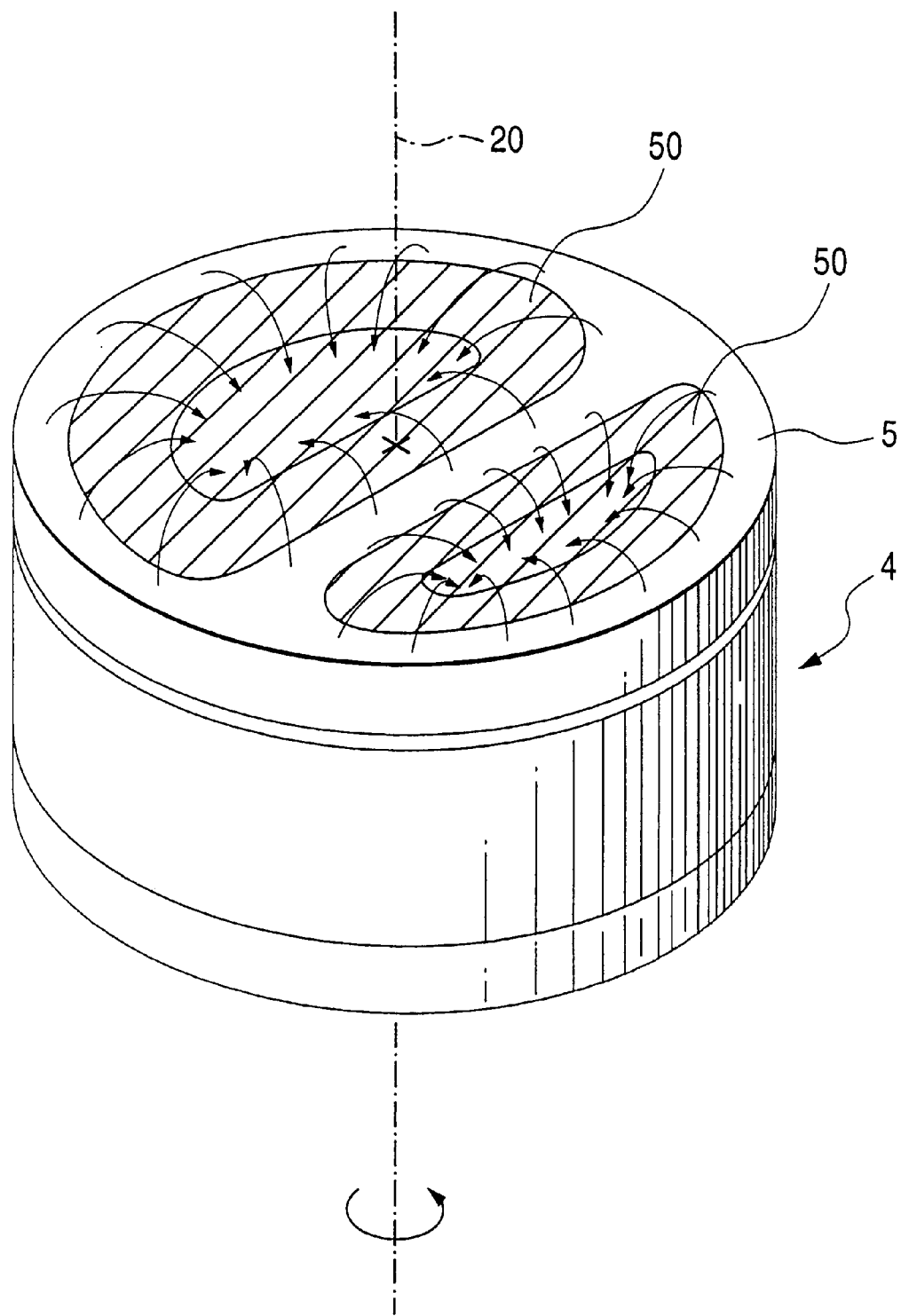
FIG. 3 is a schematic perspective view illustrating the configuration of the cathode in the apparatus of FIG. 1, and the configuration of circumferential magnetic fields which are produced on a target by the magnet mechanism.

The apparatus of FIG. 1 is mainly characterized in the configuration of the cathode 2. FIGS. 2 and 3 are views illustrating the configuration of the cathode 2 in the apparatus of FIG. 1. FIG. 2 is a schematic perspective view illustrating the configuration of a magnet mechanism 4, and FIG. 3 is a schematic perspective view illustrating the configuration of circumferential magnetic fields which are produced on a target 5 by the magnet mechanism 4 of FIG. 2.

The cathode 2 comprises the magnet mechanism 4 and the target 5 which is disposed in front of the magnet mechanism 4. The cathode power source 21 applies the given voltage to the cathode. The embodiment is characterized in that a plurality of circumferential magnetic fields are set on the surface of the target 5 and a plurality of erosion regions having a circumferential shape are formed so as not to cross each other.

The magnet mechanism 4 will be specifically described here. The magnet mechanism 4 comprises a disk-shaped yoke 421, and one N-pole magnet 422 and two S-pole magnets 423 and 424. These magnets are fixed onto the yoke 421. As shown in FIG. 2, the N-pole magnet 422 has a shape consisting of an annular outer peripheral portion which elongates along the peripheral edge of the yoke 421, and a linear portion which elongates so as to partition the inner space surrounded by the outer peripheral portion, at a position deviated from the center. One of the two S-pole magnets is the first S-pole magnet 423 which is located at the center of the larger space formed by the linear portion, and the other S-pole magnet is the second S-pole magnet 424 which is located at the center of the smaller space. The center axis 20 passes through the vicinity of the center of the gap between the first S-pole magnet 423 and the linear portion of the N-pole magnet 422.

As shown in FIG. 3, according to the thus configured magnet mechanism 4, two circumferential magnetic fields having different sizes are set on the surface of the target 5. Specifically, arcuate leakage lines of magnetic force emerging from the N-pole magnet 422 and reaching the first S-pole magnet 423 are ranged into a circumferential shape so as to set the first circumferential magnetic field above the periphery of the first S-pole magnet 423, and arcuate leakage lines of magnetic force emerging from the N-pole magnet 422 and reaching the second S-pole magnet 424 are ranged into a circumferential shape so as to set the second circumferential magnetic field above the periphery of the second S-pole magnet 424. Two erosion regions 50 which have a circumferential shape and do not cross each other as shown in FIG. 3 are formed by the two circumferential magnetic fields.

The magnet mechanism 4 of the embodiment is rotated by a rotation mechanism 22 as described later. It is a matter of course that, when the magnet mechanism 4 is stationary, the above-mentioned formation of plural erosion regions 50 is attained. When the magnet mechanism 4 is rotated, the erosion regions 50 revolve about the center axis 20, and hence the erosion regions 50 spread over a substantially whole area of the face of the target 5 (a single region is formed).

When the plural erosion regions 50 having a circumferential shape are formed on the target 5 so as not to cross each other as described above, the diameter of the deepest erosion portion of each erosion region 50 (in the case where the deepest erosion portion is not circular, the length of the shortest line connecting arbitrary two points on the circumference) is always smaller than that of the deepest erosion portion attained by the conventional technique in which a single erosion region 50 is formed. When the diameter of the deepest erosion portion is small, the incident angle of sputter particles can be made small without increasing the TS distance.

Figure 4:
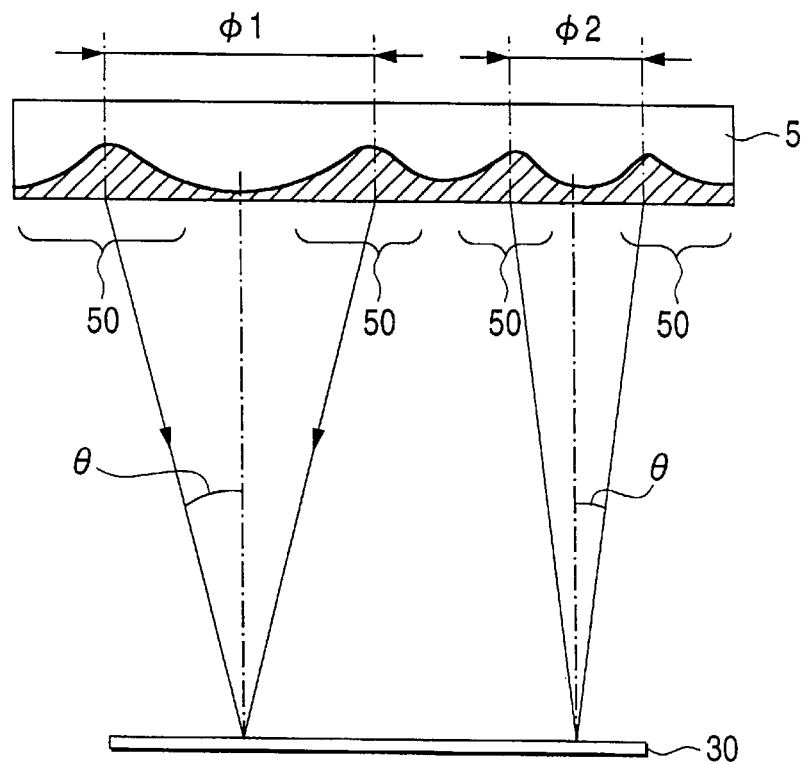
FIG. 4 is a schematic section view illustrating the function of the embodiment shown in FIGS. 1 to 3, and taken along the line X—X of FIG. 2.

This will be described in detail with reference to FIG. 4. FIG. 4 is a schematic section view illustrating the function of the embodiment shown in FIGS. 1 to 3.

In the sectional shape of erosion in the target 5 indicated by the hatched portion in FIG. 4, when the substrate 30 is seen from the deepest erosion portion, the portion of the surface of the substrate 30 where the largest incident angle is formed is located so as to be coaxial with the center portion of the circumferential deepest erosion portion in the same manner as that shown in FIG. 18. The incident angle θ of sputter particles emerging from the deepest erosion portion and impinging on this portion is apparently smaller than that such as shown in FIG. 18 in which a single erosion region is formed.

As seen from the above description, according to the configuration of the embodiment, the incident angle of sputter particles can be made small without increasing the TS distance. Consequently, the bottom coverage ratio can be improved while maintaining a required film deposition rate, and the embodiment is most suitable as a practical film deposition technique for a next-generation integrated circuit which is further highly integrated.

When the size of the gap between the two erosion regions 50 is large, there may arise the case where the largest incident angle is attained in the portion of the substrate 30 opposing the gap. Therefore, the gap between the erosion regions 50 should be set to be as small as possible. Ideally, the gap is not larger than one half of the diameter of the deepest erosion portion.

In order to improve the bottom coverage ratio, preferably, the diameter of each deepest erosion portion is not larger than that of the substrate. When the diameter of each deepest erosion portion is equal to or larger than that of the substrate 30, the incident angle of sputter particles is equal to or larger than the limit in the same manner as the conventional technique. However, it is considered that such a situation does not occur unless a target which is extremely larger than a substrate is used or a substrate which is extremely smaller than a target is used.

Figure 5:
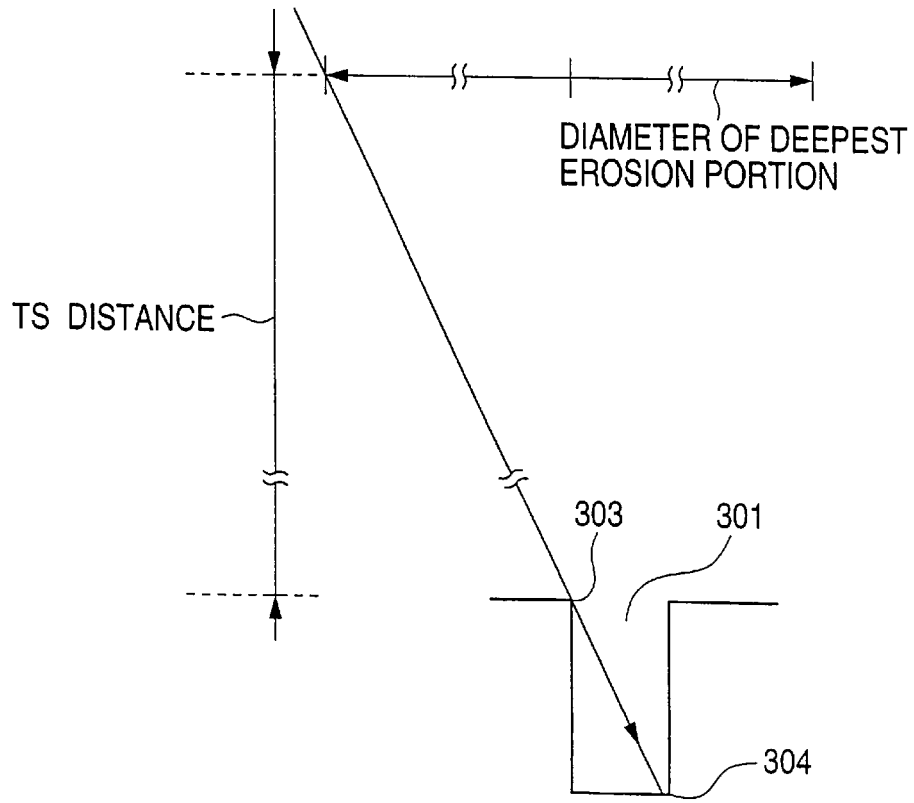
FIG. 5 is a diagram illustrating relationships between the diameter of each deepest erosion portion and the aspect ratio with respect to the TS distance.

The limit of the diameter of each deepest erosion portion with respect to the TS distance depends on the aspect ratio of the fine hole to be covered, etc. FIG. 5 is a diagram illustrating relationships between the diameter of each deepest erosion portion and the aspect ratio with respect to the TS distance.

As described above, in a process of manufacturing an integrated circuit of 256 Mbits or more, the film deposition must be conducted in a fine hole of an aspect ratio of 2 or higher. Hereinafter, the case where a film is to be deposited in a fine hole 301 of an aspect ratio of 2 by using the deepest erosion portion equal to the TS distance will be considered. As shown in FIG. 5, sputter particles emerging from the deepest erosion portion pass an edge 303 of the opening of the hole and reach an edge 304 which is at the bottom of the hole and opposes the edge 303. In other words, the film deposition in a fine hole of an aspect ratio of 2 has the limit of (diameter of the deepest erosion portion)=(TS distance). When the diameter of the deepest erosion portion exceeds the limit, the bottom coverage ratio is extremely lowered. In the film deposition technique for a next-generation device in which the aspect ratio is 2 or more, therefore, it is preferable to set the diameter of the deepest erosion portion equal to or smaller than the TS distance.

Next, the configuration of the other portion of the embodiment and the operation of the whole will be briefly described.

As the pumping system 11, a system which can attain the degree of vacuum of about $10^{-8}$ Torr is employed. During the film deposition process, a discharging gas such as argon is introduced into the vacuum vessel 1 so as to maintain the degree of vacuum of about 0.3 mTorr, so that the effect of preventing sputter particles from scattering is attained in the same manner as low-pressure long-distance sputtering described above.

A gate valve (not shown) is attached to the wall of the vacuum vessel 1. A transfer system (not shown) which carries in and out the substrate 30 through the gate valve is disposed. A load-lock chamber (not shown) is juxtaposed with the vacuum vessel 1 through a gate valve. In the load-lock chamber which is isolated from the vacuum vessel 1, the substrate 30 is returned in the atmospheric pressure.

The cathode 2 is configured in the manner described above. In the embodiment, the rotation mechanism 22 for rotating the cathode 2 about the center axis 20 is attached. The rotation mechanism 22 is used for uniformizing erosion on the target 5, and comprises a rotation shaft 221 which is connected to the back face of the yoke 421 and coaxial with the center axis 20, and a driving source 222 for rotating the rotation shaft 221. As described above, the portion of the target 5 which is in the vicinity of the center axis 20 is included in the erosion region 50. Consequently, this portion is prevented from remaining noneroded when the magnet mechanism 4 is rotated, whereby the utilization efficiency of the target 5 is further enhanced.

A mechanism which attracts and holds the substrate 30 by means of electrostatic attraction, and a heating mechanism which heats the substrate 30 to a constant temperature during the process of film deposition are disposed in the substrate holder 3. As required, a bias power source for applying a given bias voltage to the substrate 30 is connected to the substrate holder 3.

The gas introducing system 7 introduces a gas required for sputtering discharge into the vacuum vessel 1, and comprises a pipe 71 connected to a gas cylinder which is not shown, a flow controller 72 connected to the pipe, a valve 73, etc. When reactive sputtering is to be conducted, a reactive gas may be introduced with mixing with the discharging gas.

The cathode power source 21 applies a given negative DC voltage or radio-frequency voltage which is necessary for sputtering discharge, to the cathode 2. Usually, a negative DC voltage is applied when the target 5 is made of a metal, and a radio-frequency voltage is applied when the target is made of a dielectric or the like. The vacuum vessel 1, the substrate holder 3 in the case where no bias is applied, and the like are grounded so as to be electrically maintained to the ground level. The voltage applied to the cathode 2 produces an electric field between these members and the cathode, and the electric field causes sputtering discharge to occur.

In the thus configured sputtering apparatus of the embodiment, the substrate 30 is transferred by the transfer system (not shown) into the vacuum vessel 1 through the gate valve (not shown), and then placed on the substrate holder 3. Next, the cathode power source 21 is operated so as to apply a given voltage to the cathode 2 while operating the gas introducing system 7 so as to introduce a gas into the vacuum vessel 1, thereby causing sputtering discharge to occur as described above. As a result, sputter particles are emitted from the target 5 and then reach the substrate 30 to be deposited thereon, whereby film deposition is conducted.

As described above, in the embodiment, since the erosion region 50 of a small diameter is formed on the target 5, the incident angle of sputter particles impinging on the substrate 30 is small. As compared with the conventional system, therefore, the bottom coverage ratio of a fine hole is remarkably improved.

Next, a second embodiment of the invention will be described.

Figure 6:
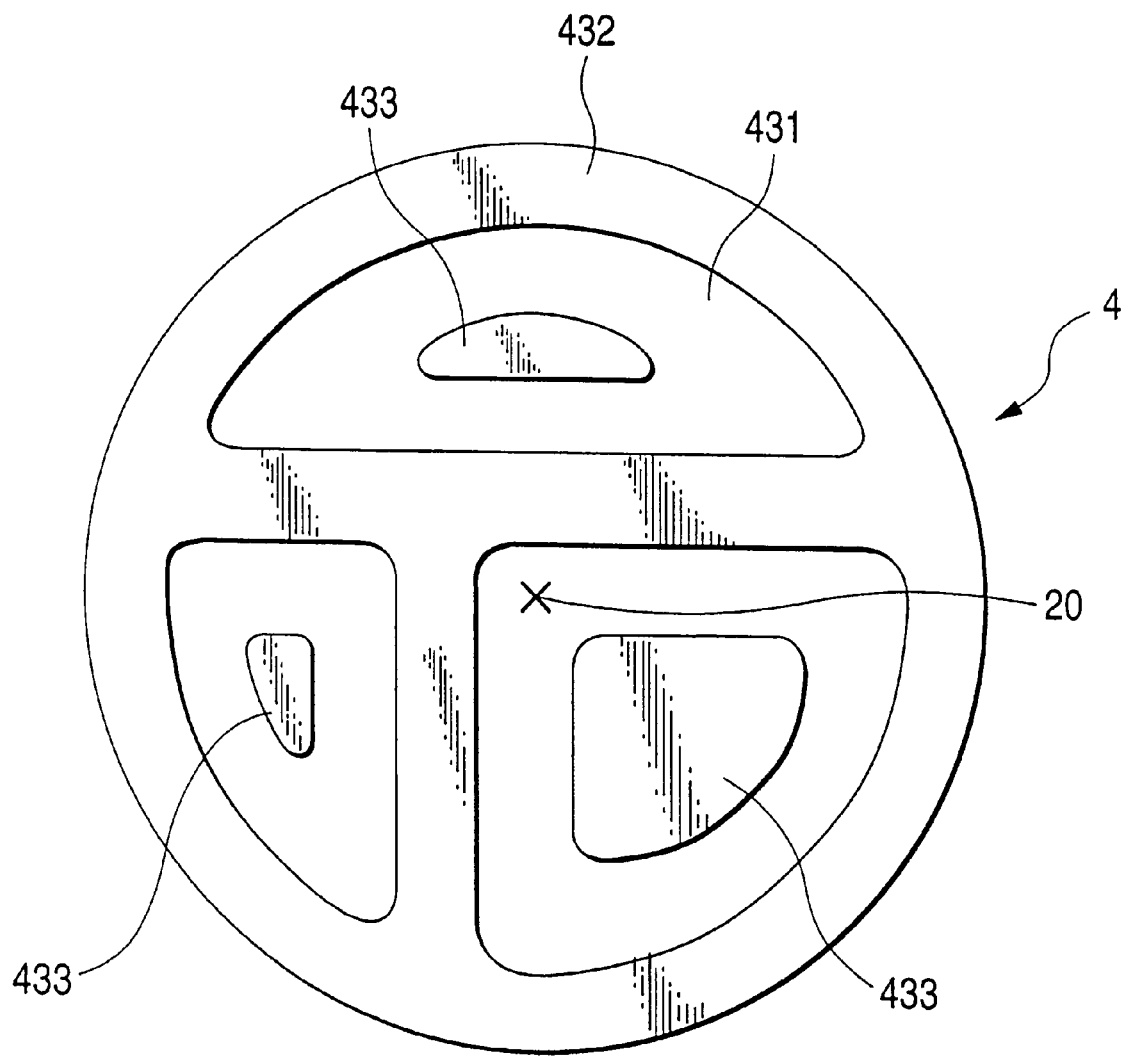
FIG. 6 is a schematic plan view illustrating the configuration of a cathode used in a second embodiment of the invention.

FIG. 6 is a schematic plan view illustrating the configuration of a cathode used in the second embodiment of the invention. The second embodiment sets three circumferential magnetic fields as shown in FIG. 6. Specifically, in the second embodiment, a magnet mechanism 4 constituting a cathode 2 comprises an N-pole magnet 432 and three S-pole magnets 433 which are fixed onto a yoke 431. The N-pole magnet 432 has a shape consisting of an annular outer peripheral portion which elongates along the peripheral edge of the yoke 431, and two linear portions which elongate so as to partition the inner space surrounded by the outer peripheral portion into three spaces. The S-pole magnets 433 are located at the centers of the three spaces inside the outer peripheral portion, respectively.

Three erosion regions 50 are formed on the target 5 so as not to cross each other by the three circumferential magnetic fields shown in FIG. 6. Also in the second embodiment, therefore, the deepest erosion portion has a reduced diameter, and hence the effect of reducing the incident angle of sputter particles can be attained in the same manner as in the first embodiment. As compared with the first embodiment, in the present embodiment in which the three circumferential magnetic fields are set, the diameters of the erosion regions 50 can be made smaller than those in the case where two circumferential magnetic fields are set.

The components other than the magnet mechanism 4 can be configured in the same manner as those of the first embodiment, and hence their description is omitted.

Figure 7:
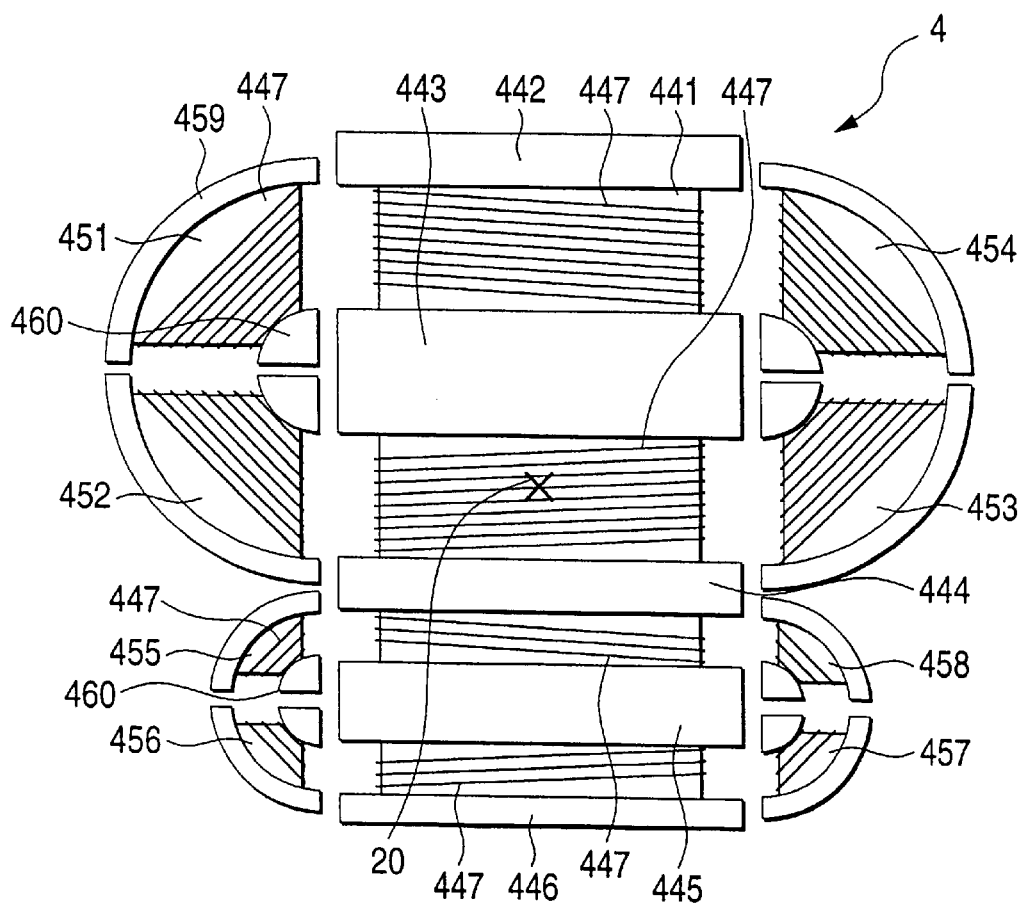
FIG. 7 is a plan view illustrating a third embodiment of the invention.
Figure 8:
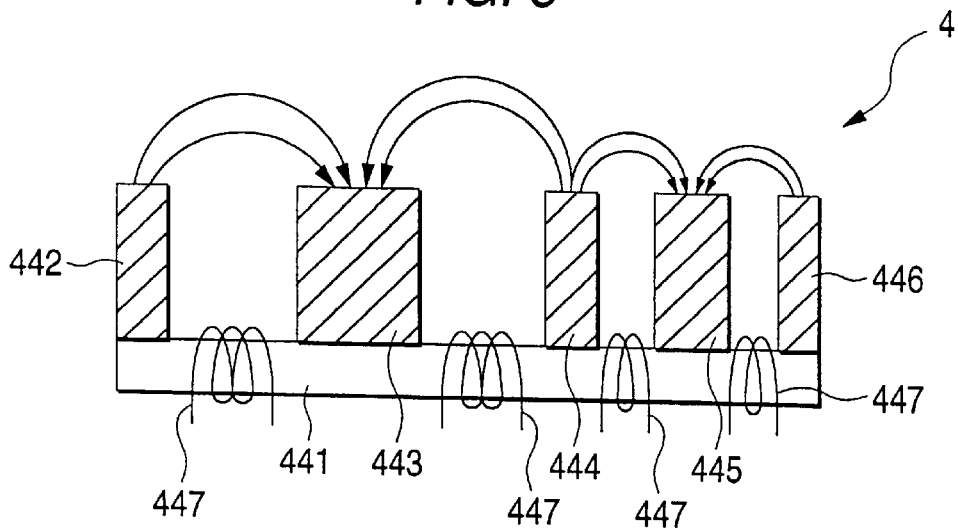
FIG. 8 is a sectional side view illustrating the third embodiment of the invention.

Next, a third embodiment of the invention will be described. FIGS. 7 and 8 are views illustrating the third embodiment of the invention. FIG. 7 is a plan view, and FIG. 8 is a sectional side view. In the first and second embodiments, the magnet mechanism 4 is configured by permanent magnets. In the third embodiment, the magnet mechanism is configured by electromagnets. Specifically, the magnet mechanism 4 comprises: a plate-shaped core member 441; five or first to fifth pole members 442, 443, 444, 445, and 446 which are fixed onto the core member 441 and leak lines of magnetic force onto a target 5; and field coils 447 wound on the core member 441.

The core member 441 is a rectangular plate-shaped member and placed in parallel with the target 5. The five pole members 442, 443, 444, 445, and 446 are band-plate-shaped members which are arranged with directing the width direction toward the target 5. The pole members are fixed to the surface of the target 5 by welding or the like so as to have a posture in which the direction of the long side coincides with that of the short side of the rectangular core member 441. Specifically, the first and fifth pole members 442 and 446 which constitute N-poles are respectively fixed to the edges of the opposing short sides of the core member 441, and the third pole member 444 which similarly constitutes an N-pole is fixed to a position shifted from the middle portion of the long side toward the fifth pole member 446. The second pole member 443 which constitutes an S-pole is fixed to the middle portion between the first and third pole members 442 and 444, and the fourth pole member 445 which similarly constitutes an S-pole is fixed to the middle portion between the third and fifth pole members 444 and 446.

The field coils 447 are wound on the portions of the core member 441 which are between the first and second pole members 442 and 443, the second and third pole members 443 and 444, the third and fourth pole members 444 and 445, and the fourth and fifth pole members 445 and 446, respectively. DC currents of a direction are supplied to the field coils 447. As a result, first leakage lines of magnetic force emerging from the first and third pole members 442 and 444 which are N-poles and reaching the second pole member 443 which is an S-pole, and second leakage lines of magnetic force emerging from the third and fifth pole members 444 and 446 which are N-poles and reaching the fourth pole member 445 which is an S-pole are set, respectively.

As shown in FIG. 7, eight auxiliary core members 451, 452, 453, 454, 455, 456, 457, and 458 are arranged on the both sides of the core member 441. The eight auxiliary core members 451, 452, 453, 454, 455, 456, 457, and 458 are plate-shaped similarly to a sector of a quadrant. Each of the auxiliary core members 451, 452, 453, 454, 455, 456, 457, and 458 comprises a band-plate-shaped peripheral pole member 459 which is fixed to the peripheral portion of the sector, and a column-shaped center pole member 460 which is fixed to the pivotal portion of the sector.

Among the eight auxiliary core members 451, 452, 453, 454, 455, 456, 457, and 458, the four or first to fourth auxiliary core members 451, 452, 453, and 454 have a radius which is substantially equal to the distance between the first or third pole member 442 or 444 and the second pole member 443, and the fifth to eighth auxiliary core members 455, 456, 457, and 458 have a radius which is substantially equal to the distance between the third or fifth pole member 444 or 446 and the fourth pole member 445. A field coil 447 is wound on each of the auxiliary core members 451, 452, 453, 454, 455, 456, 457, and 458 so that arcuate leakage lines of magnetic force stretch across the peripheral pole member 459 and the center pole member 460.

As shown in FIG. 7, the first to fourth auxiliary core members 451, 452, 453, and 454 are arranged so that their center pole members 460 are positioned in the vicinity of the both ends of the second pole member 443 and their peripheral pole members 459 cooperate with the first and third pole members 442 and 444 to have a circumferential shape. Similarly, the fifth to eighth auxiliary core members 455, 456, 457, and 458 are arranged so that their center pole members 460 are positioned in the vicinity of the both ends of the fourth pole member 445 and their peripheral pole members 459 cooperate with the third and fifth pole members 444 and 446 to have a circumferential shape.

In this arrangement, arcuate lines of magnetic force set by the pole members are ranged into a circumferential shape, and two circumferential magnetic fields are juxtaposed. When the target 5 is coaxially disposed so that the middle portion between the second and third pole members 443 and 444 coincides with the center axis 20, the configuration of the cathode 2 which is substantially equivalent to the magnet mechanism 4 shown in FIG. 2 is achieved by the electromagnets. Also in the third embodiment, when the magnet mechanism 4 is rotated about the center axis 20, erosion can be uniformized and the utilization efficiency of the target 5 can be enhanced.

Figure 9:
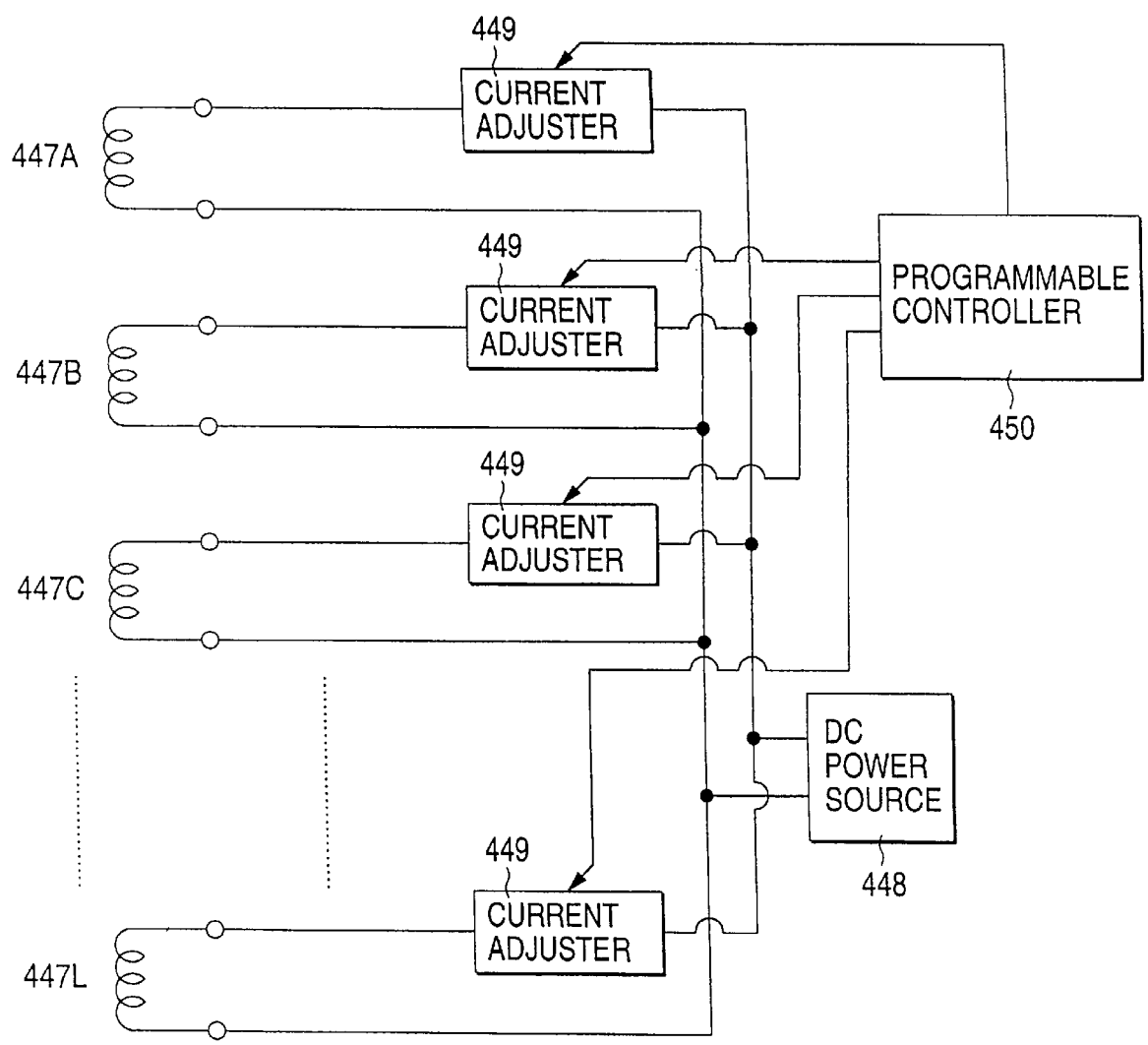
FIG. 9 is a diagram illustrating an application example in which current controlling means for independently controlling currents supplied to field coils is added to the third embodiment shown in FIGS. 7 and 8.
Figure 10:
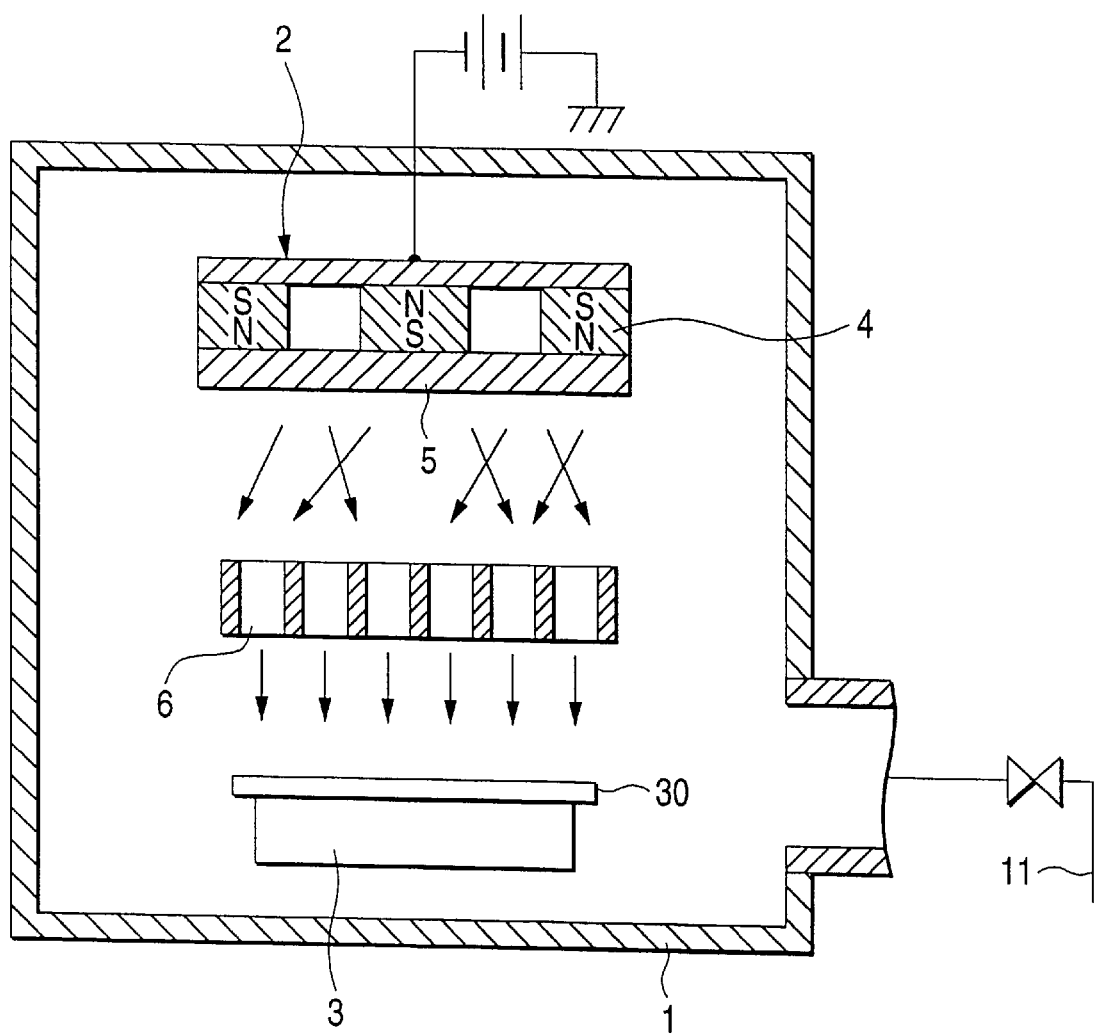
FIG. 10 is a view schematically illustrating a collimate sputtering apparatus as an example of a conventional sputtering apparatus in which the bottom coverage ratio is improved.
Figure 11:
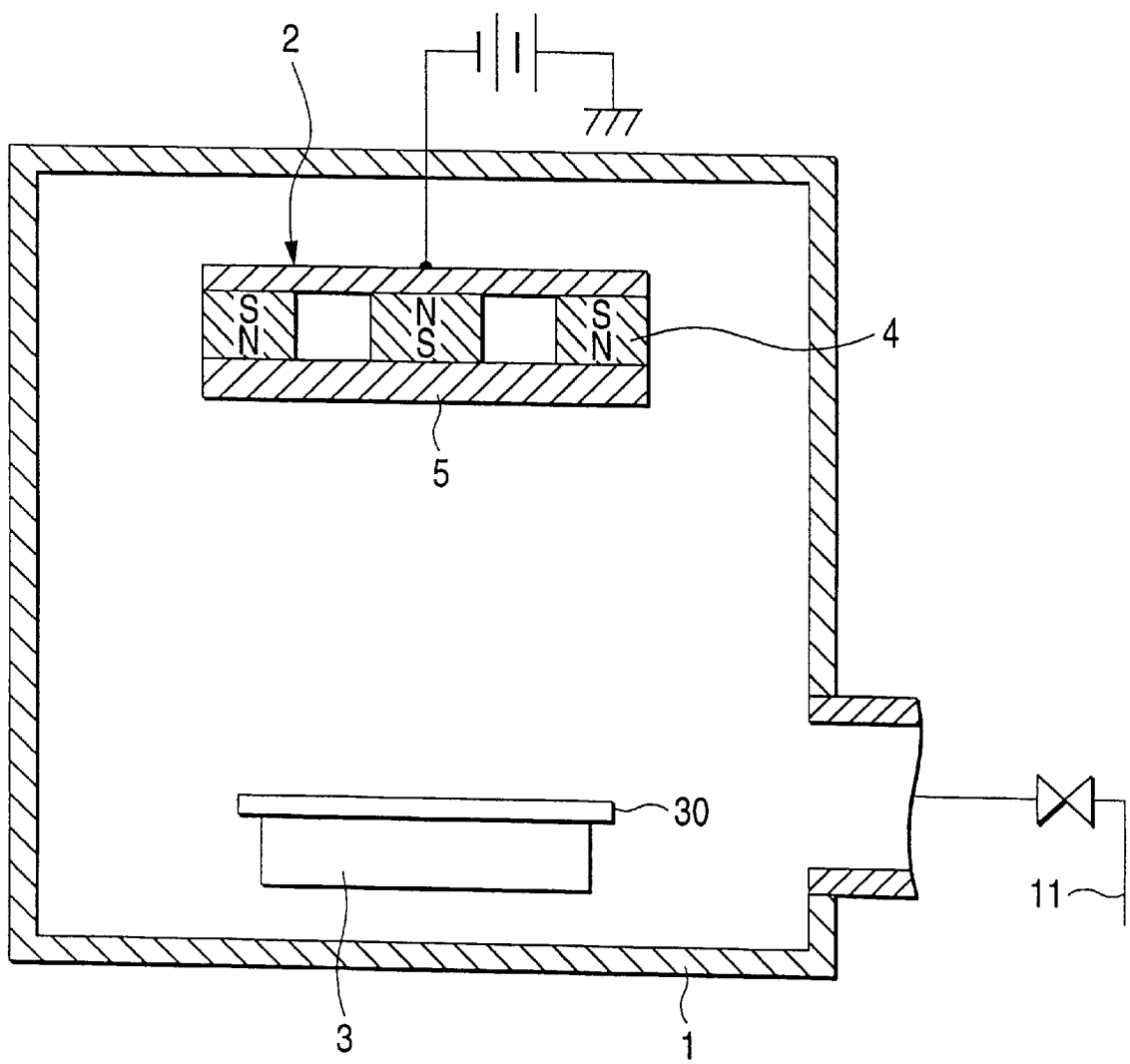
FIG. 11 is a view schematically illustrating a low-pressure long-distance sputtering apparatus as another example of a conventional sputtering apparatus.
Figure 12:
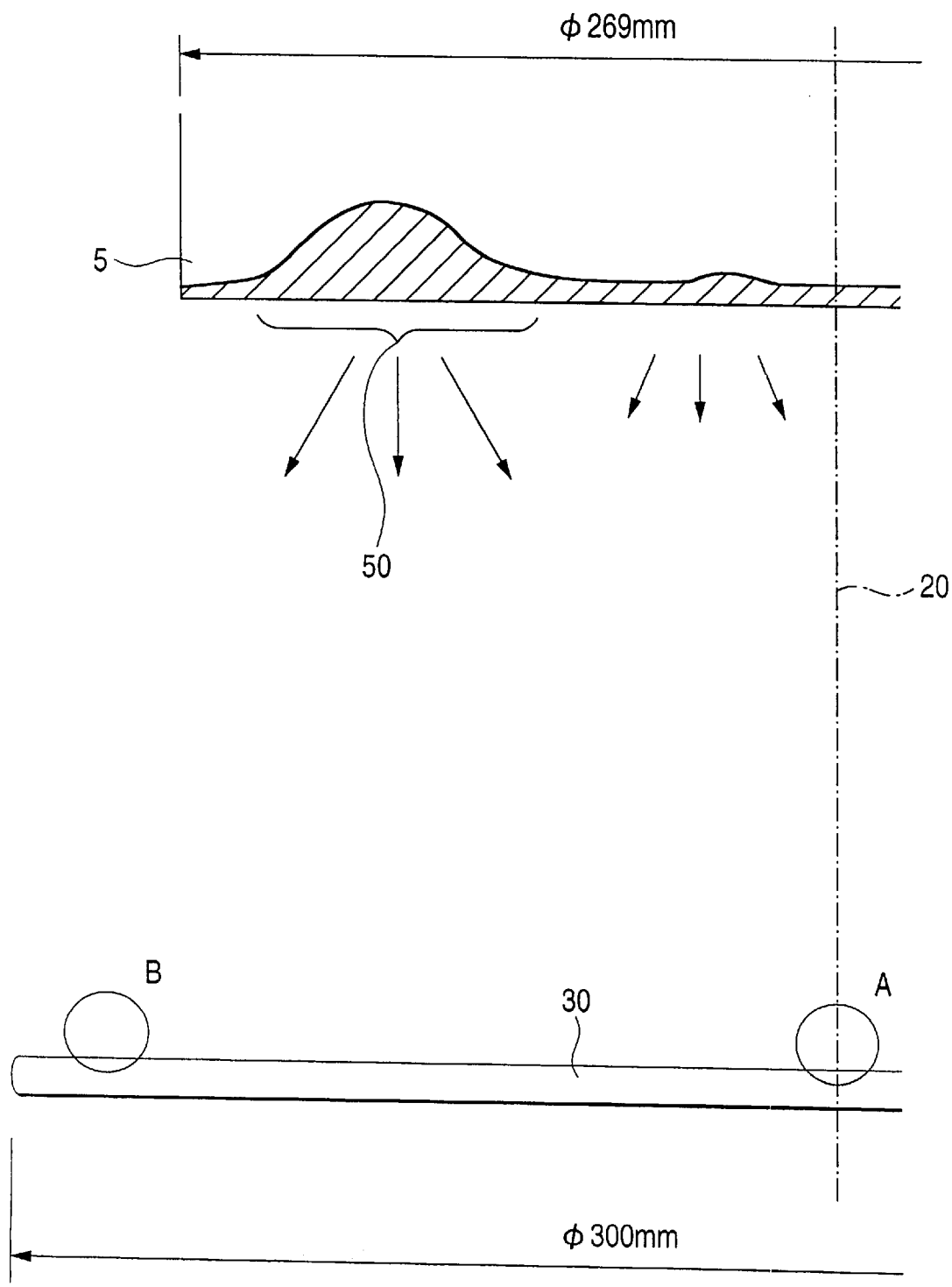
FIG. 12 illustrates a problem which may arise in the film deposition on a large substrate with using the apparatus of FIG. 11, and is a partial diagrammatic view of a target and a substrate in the apparatus.
Figure 13:
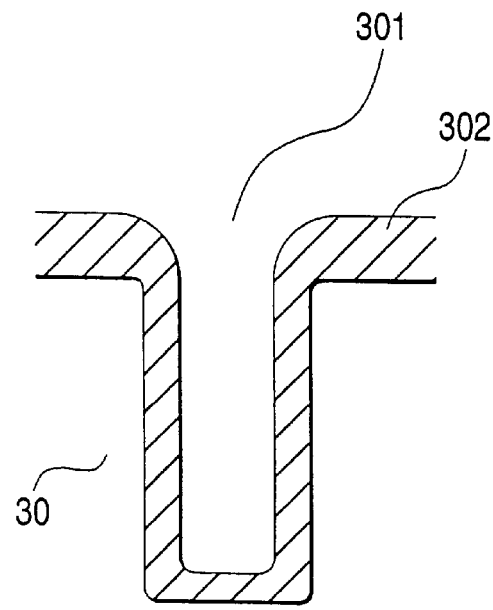
FIGS. 13 (A) and 13 (B) illustrate a problem which may arise in the film deposition on a large substrate with using the apparatus of FIG. 11 in the same manner as FIG. 12, and are section views showing the bottom coverage ratios of the vicinity of the center of the substrate and the peripheral portion thereof, respectively.
Figure 13:
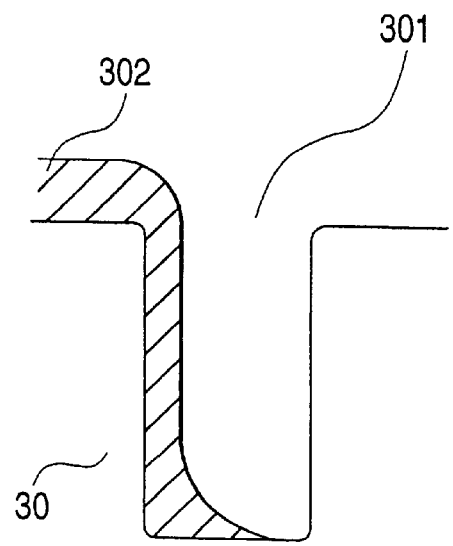
Figure 14:
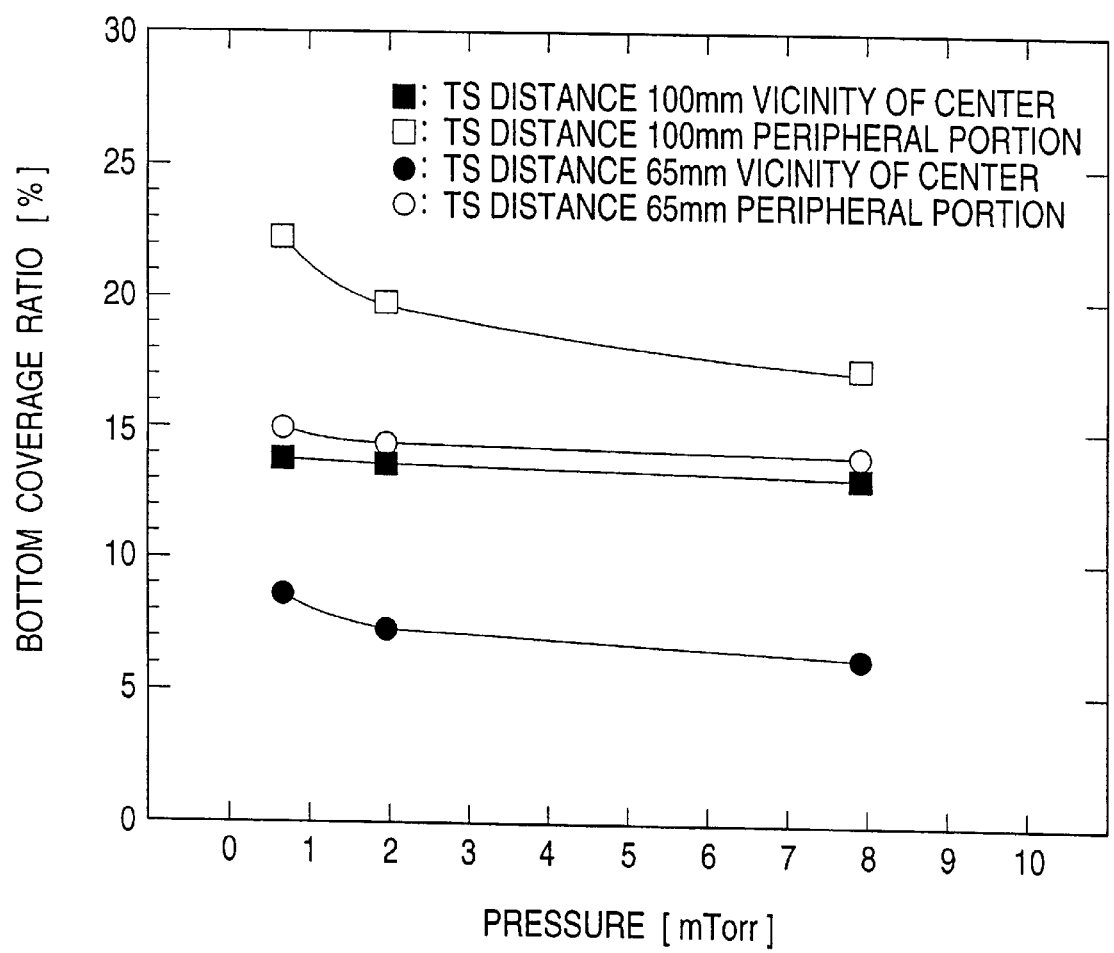
FIG. 14 shows experimental data relating to low-pressure long-distance sputtering, and is a graph of data indicating the dependence of the bottom coverage ratio on the pressure and the TS distance.
Figure 15:
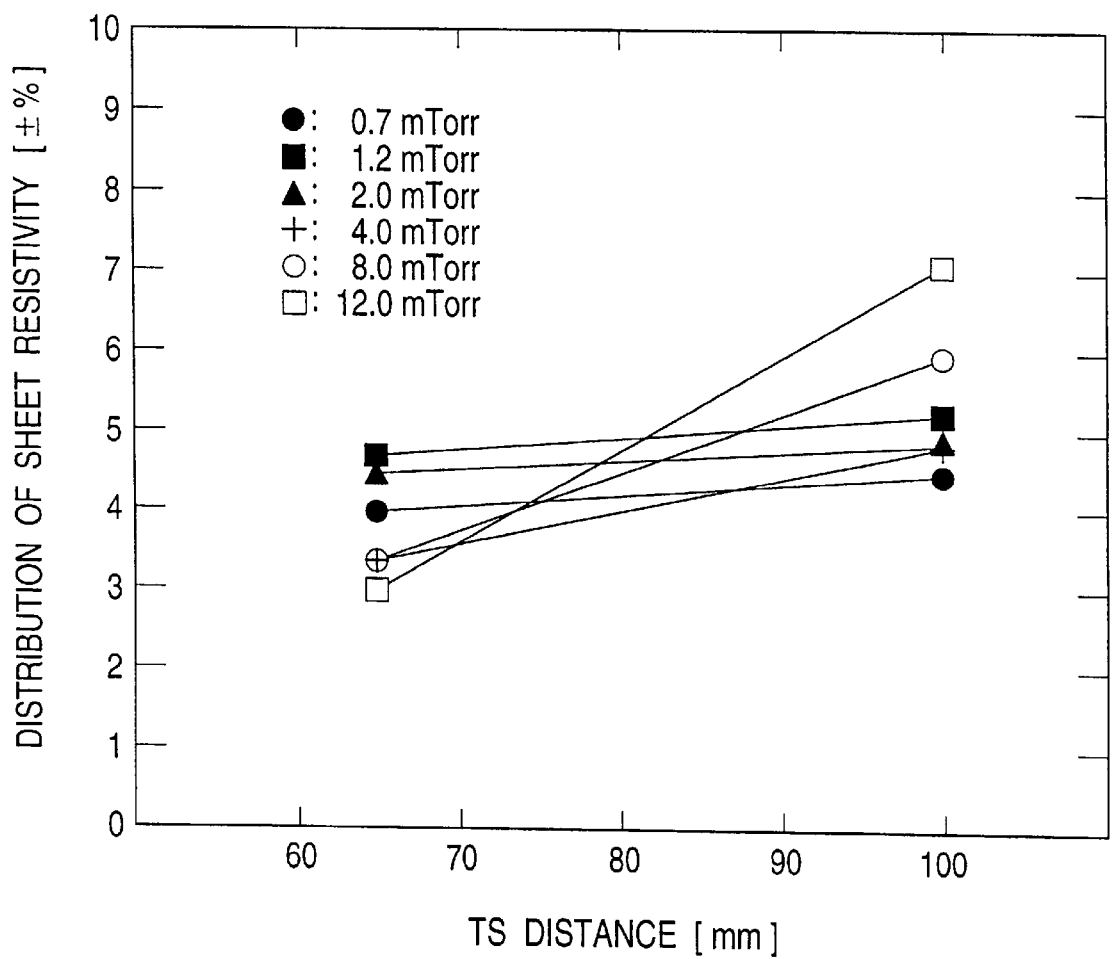
FIG. 15 similarly shows experimental data relating to low-pressure long-distance sputtering, and is a graph of data indicating the dependence of the distribution of the sheet resistivity of an obtained thin film on the pressure and the TS distance.
Figure 16:
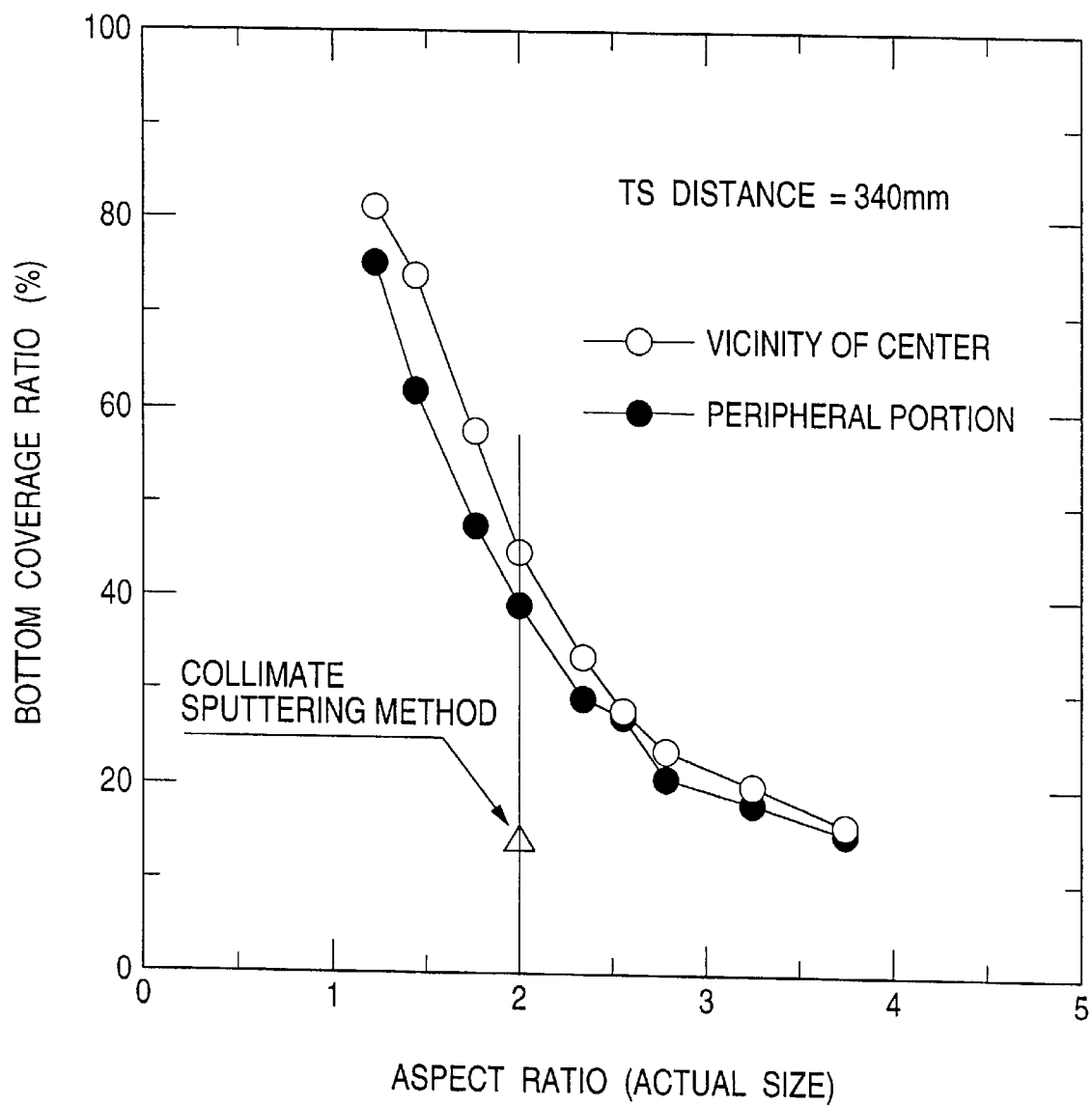
FIG. 16 similarly shows experimental data relating to low-pressure long-distance sputtering, and is a graph of data indicating relationships between the bottom coverage ratio and the aspect ratio in the case where the TS distance is 340 mm.
Figure 17:
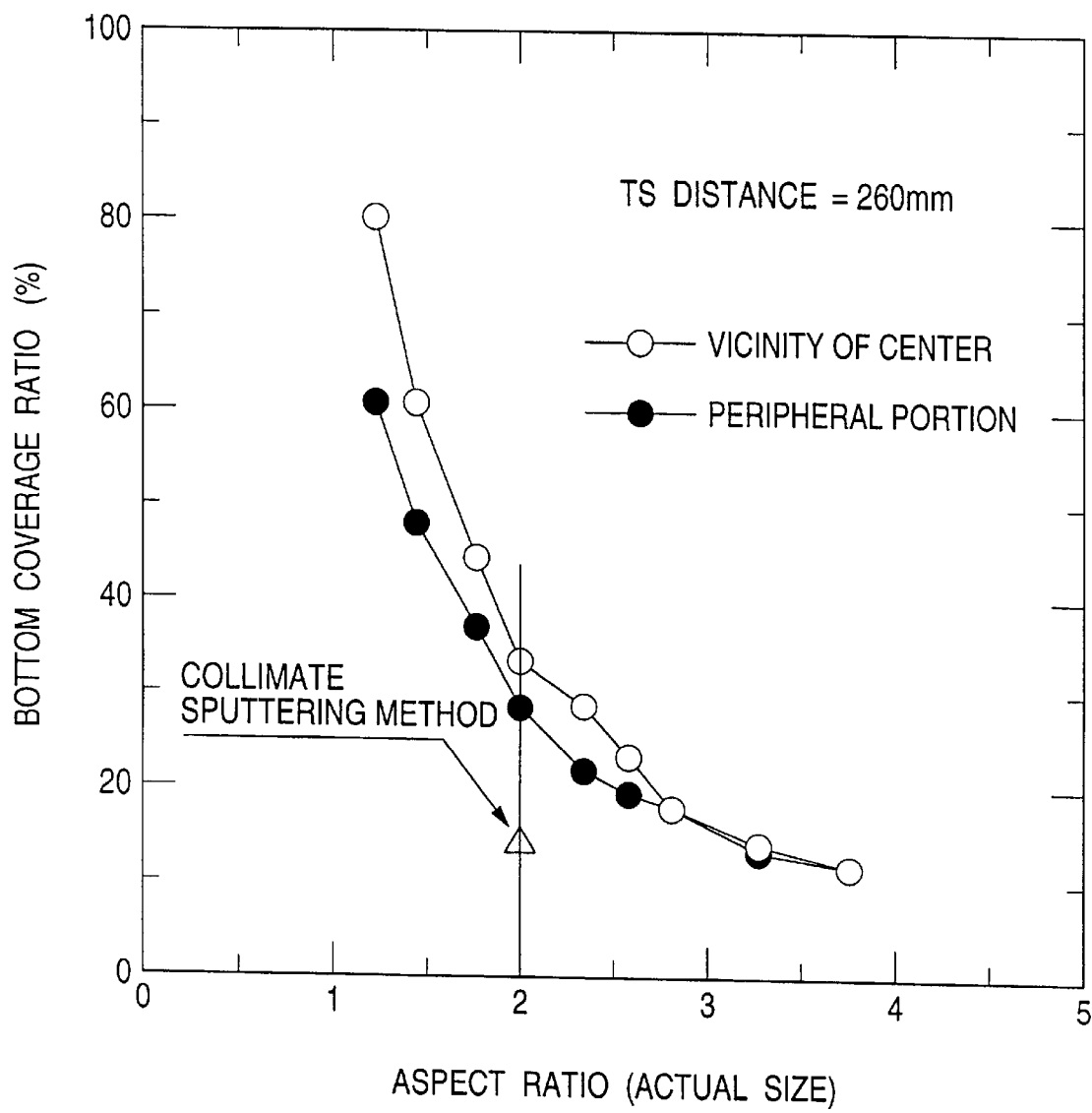
FIG. 17 similarly shows experimental data relating to low-pressure long-distance sputtering, and is a graph of data indicating relationships between the bottom coverage ratio and the aspect ratio in the case where the TS distance is 260 mm.
Figure 18A:
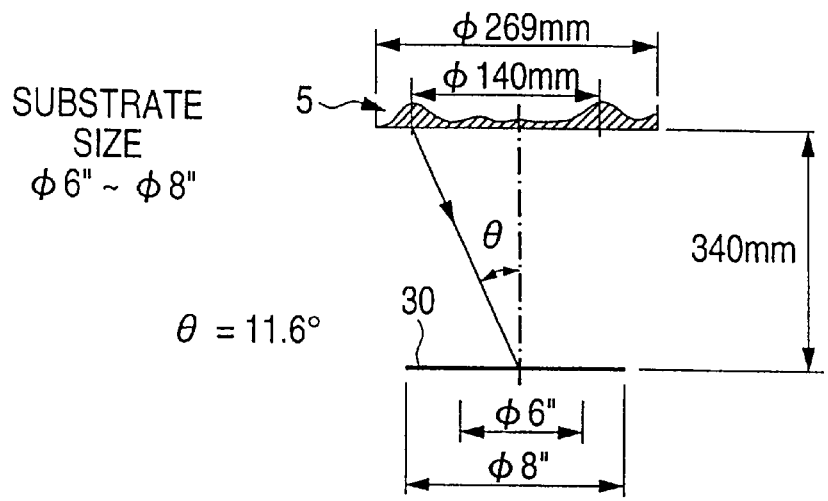
FIGS. 18(a)–18(d) are views showing results of studies on the effects of the enlarged size of a substrate on the bottom coverage ratio and the film deposition rate.
Figure 18B:
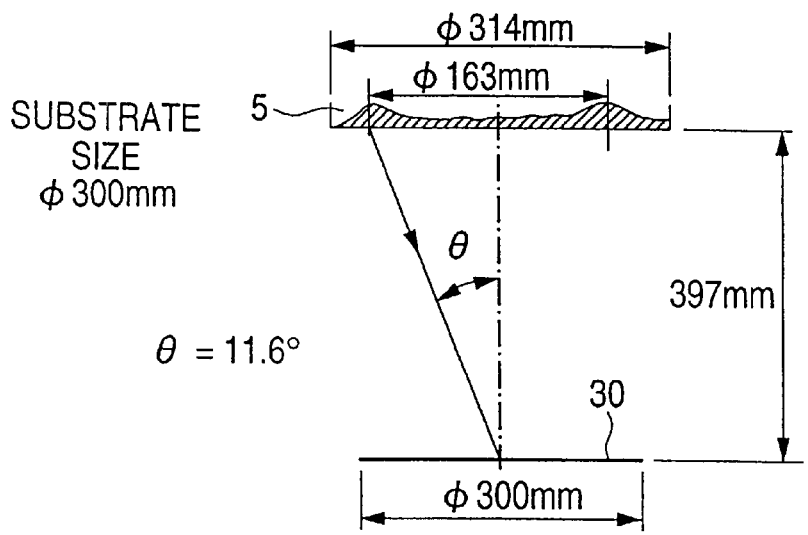
Figure 18C:
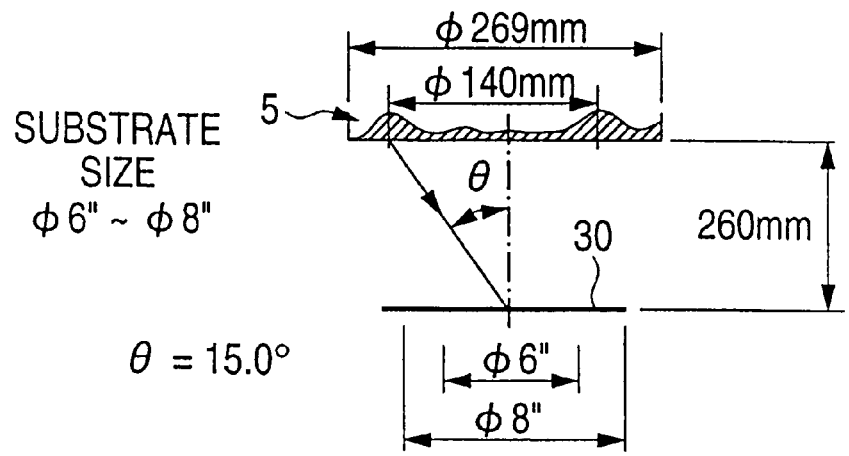
Figure 18D:
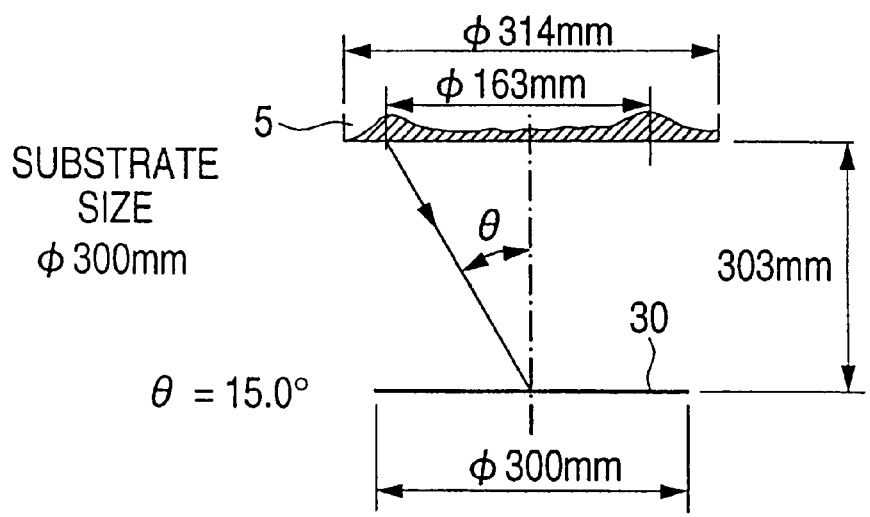
Figure 19:
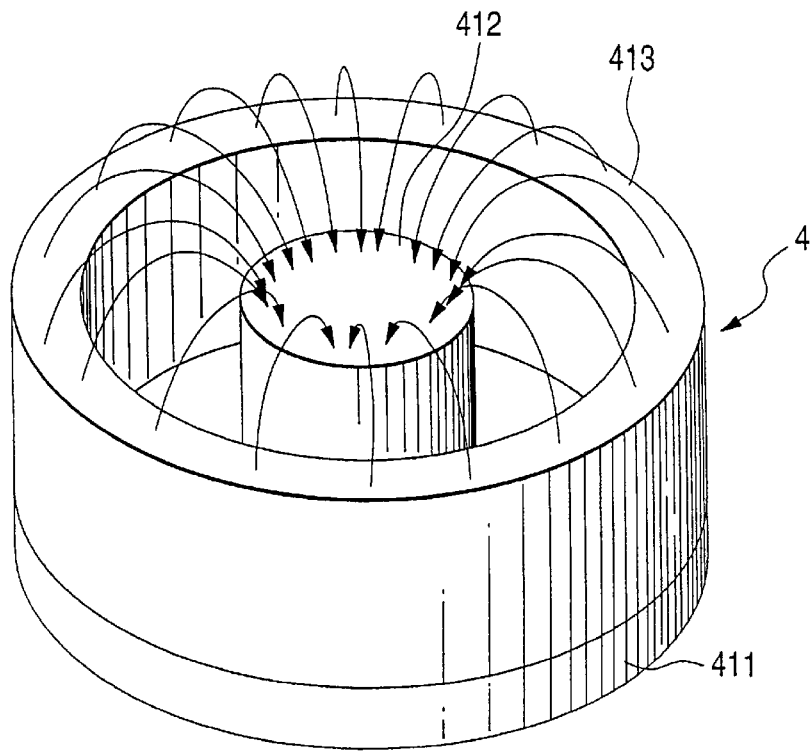
FIG. 19 illustrates the circumferential shape of a deepest erosion portion, and is a schematic perspective view of a magnet mechanism used in a conventional apparatus.
Figure 20:
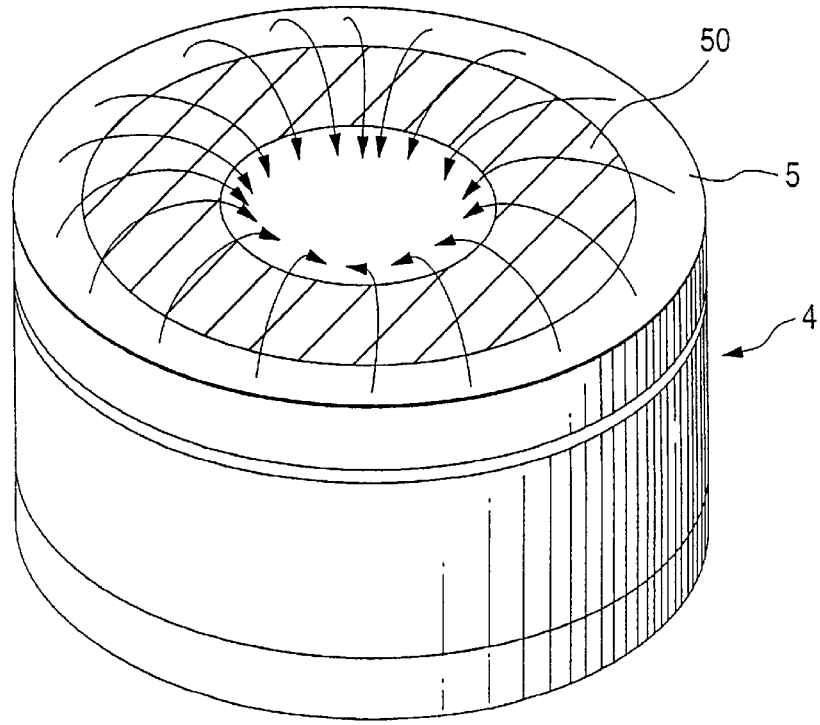
FIG. 20 illustrates the circumferential shape of a deepest erosion portion, and is a schematic perspective view of a cathode used in the conventional apparatus.

In the third embodiment using the electromagnets, the distribution of the magnetic field is adjusted by controlling the currents respectively supplied to the field coils 447, so that the distribution of the film thickness can be improved. This will be described with reference to FIG. 9. FIG. 9 is a diagram of an application example in which current controlling means for independently controlling the currents supplied to the field coils is added to the third embodiment shown in FIGS. 7 and 8.

The current controlling means of the example comprises: a DC power source 448 which supplies a DC current to the field coils 447A, 447B, . . . , 447L; current adjustors 449 which are respectively connected to current supply circuits from the DC power source 448 to the field coils 447A, 447B, . . . , 447L; and a programmable controller 450 which controls the current adjustors 449 to adjust the levels of the currents supplied to the field coils 447A, 447B, . . . , 447L.

The process of film deposition using the cathode 2 shown in FIGS. 7 and 8 will be described. When it is judged that the film deposition rate of the periphery of the substrate 30 is lower than that of the center portion and the planar uniformity of the distribution of the film thickness is not sufficient, for example, the levels of the currents supplied to the field coils 447 wound on the eight auxiliary core members 451, 452, 453, 454, 455, 456, 457, and 458 are controlled so as to be relatively raised. As the current adjustors 449, for example, devices which use a thyristor or the like and can turn on and off the current supply at a constant period may be employed, and the on/off period may be adjusted in accordance with a signal from the programmable controller 450.

The period of the currents supplied to the eight field coils 447 wound on the auxiliary core members 451, 452, 453, 454, 455, 456, 457, and 458 is made substantially longer than that of the currents supplied to the four field coils 447 wound on the core member 441 shown in FIG. 7. This causes the magnetic flux density of leakage lines of magnetic force due to the auxiliary core members 451, 452, 453, 454, 455, 456, 457, and 458 to be relatively higher, thereby enhancing erosion in the periphery of the target 5. As a result, the film deposition rate of the periphery of the substrate 30 is improved and the planar uniformity of the distribution of the film thickness is enhanced.

The independent control of the levels of supplied currents may be conducted in such a manner that two electromagnet groups setting two circumferential magnetic fields are independently controlled, or all electromagnets are independently controlled. As far as at least two groups can be independently controlled, it is possible to exert a magnetic field adjusting function of any kind.

In the embodiments described above, the number of the circumferential magnetic fields is two or three. Alternatively, the number may be four or more. As the number of circumferential magnetic fields is larger, generally, the incident angle of sputter particles at the same TS distance is smaller. Therefore, a larger number of circumferential magnetic fields are preferable from the viewpoint of improvement of the bottom coverage ratio.

The rotation mechanism 22 may rotate the target 5 in place of the magnet mechanism 4. The center axis 20 of the magnet mechanism 4 may be deviated from the center axis of the target 5 by a distance so that the magnet mechanism 4 revolves about the center axis of the target 5.

In the specification, the term "circumferential shape" has the broadest meaning, and includes all shapes such as a circular shape, an elliptical shape, an oval shape, a polygonal shape, and a circumference which is uneven such as a wavy line. The circumference is not required to form a complete loop, and may be partly incomplete. Even a circumferential magnetic field or the circumferential erosion regions 50 having a partial interrupted portion may be satisfactorily used as far as problems due to the incompleteness, such as the uneven thickness of the deposited film are within limits.

The deepest erosion portion may not have a linear shape and may have a band shape or a substantial width. A range from the deepest portion to a substantially shallow portion may be treated as the deepest erosion portion. The deepest erosion portion is a conceptual portion which is used for determining the portion of an erosion region which most significantly affects the film deposition, and hence suitably decided in accordance with the degree of influence on the film deposition.

An erosion region is a place where substantial erosion is caused to occur by the function of a magnetic field. A very small number of ions which are diffused to the outside of an erosion region and reach a substrate may impinge on a target. With the passage of time, therefore, very shallow erosion may occur also in a portion outside the erosion region. However, such erosion does not affect the state of the film deposition, and hence it is judged that such erosion is not substantial erosion. When it is supposed that the average erosion rate in the erosion region is 100%, a region where erosion at a rate of 5% or less occurs is judged that such a region is not substantially an erosion region.

Next, an example belonging to the first embodiment will be described. In the first embodiment, sputtering was conducted under the following conditions:

diameter of the target: 314 mm,

TS distance: 303 mm, diameter of the substrate: 300 mm, pressure: 0.3 mTorr, voltage applied to the cathode: −600 V, deviation of the linear portion of the N-pole magnet (distance d of FIG. 2): 40 mm, diameter of the first deepest erosion portion ($\phi 1$ of FIG. 4): 200 mm, diameter of the second deepest erosion portion ($\phi 2$ of FIG. 4): 100 mm, rotational speed of the magnet mechanism: 200 rpm, temperature of the substrate: 300° C., material of the target: titanium, and discharging gas: argon.

As a result, it was ascertained that the film deposition can be conducted on a fine hole of an aspect ratio of 2 at a bottom coverage ratio of 40 to 45%. In this case, the film deposition rate was 1,000 angstroms per minute.

As described above, according to the invention, since the bottom coverage ratio can be improved even for a large substrate while maintaining a required film deposition rate, the invention is most suitable as a practical film deposition technique for a next-generation integrated circuit.

What is claimed is:

1. A sputtering apparatus comprising:
    a vacuum vessel having a pumping system;
    a target located at a position in said vacuum vessel; and
    a magnet mechanism, which sets a magnetic field on a surface of said target, a substrate being disposed opposing said target, said target being sputtered while ions are captured by the magnetic field produced by said magnet mechanism, thereby depositing a film on a surface of the substrate;

wherein said magnet mechanism sets leakage lines of magnetic force which emerge from a portion of the surface of said target and enter another portion of the surface of said target, and also a plurality of circumferential magnetic fields of different sizes each of which is formed by ranging the leakage lines of magnetic force into a circumferential shape on the surface of said target, so that a plurality of erosion regions of different sizes are formed on the surface of said target by the circumferential magnetic fields without crossing each other, each of said erosion regions having a peripheral circumferential shape and a curved portion, and each one of said erosion regions has at least one interior side which is parallel to an interior side of at least one of said other erosion regions, and when said magnet mechanism is relatively stationary with respect to said target, an interrupted circumferential shape is formed by each curved portion of said erosion regions, one of said erosion regions including a center portion of the target; and wherein at least one of said erosion regions has an interior side which has a length longer than a radius of the target.

2. The sputtering apparatus according to claim 1, wherein said magnet mechanism sets the plurality of circumferential magnetic fields so that a length of a shortest line connecting two points on a circumference of a deepest one of the circumferential erosion regions is shorter than a diameter of the substrate.

3. The sputtering apparatus according to claim 1, wherein said magnet mechanism sets the plurality of circumferential magnetic fields so that a length of a shortest line connecting two points on a circumference of a deepest one of the circumferential erosion regions is shorter than a distance between said target and the substrate.

4. The sputtering apparatus according to claim 1, wherein said magnet mechanism sets the plurality of circumferential magnetic fields so that a distance between the circumferential erosion regions is shorter than a half of a shortest length of a line connecting two points on a circumference of a deepest one of the circumferential erosion regions.

5. The sputtering apparatus according to claim 1, wherein said magnet mechanism comprises a plurality of electromagnets, and, with respect to at least two groups of the electromagnets, a level of a current to be supplied to said electromagnets is independently controlled.

6. The sputtering apparatus according to claim 1, further comprising a rotation mechanism which rotates said magnet mechanism about a center axis of said target.

* * * * *